US006236200B1

(12) United States Patent
Nekado et al.

(10) Patent No.: US 6,236,200 B1
(45) Date of Patent: May 22, 2001

(54) MAGNETIC METAL SENSOR AND METHOD FOR DETECTING MAGNETIC METAL

(75) Inventors: Yasuo Nekado; Masaaki Kusumi, both of Kanagawa (JP)

(73) Assignee: Sony Precision Technology, Inc., Tokyo (JP)

(*) Notice: Subject to any disclaimer, the term of this patent is extended or adjusted under 35 U.S.C. 154(b) by 0 days.

(21) Appl. No.: 09/080,957

(22) Filed: May 19, 1998

(30) Foreign Application Priority Data

May 21, 1997 (JP) .................................................. 9-131058
Dec. 22, 1997 (JP) .................................................. 9-353704
Dec. 22, 1997 (JP) .................................................. 9-353705

(51) Int. Cl.[7] ....................................................... G01B 7/14

(52) U.S. Cl. ................. 324/207.26; 324/202; 324/207.2; 324/174

(58) Field of Search ............................... 324/207.26, 228, 324/243, 239, 260, 219, 220, 207.16, 207.12, 207.24, 207.25, 332, 236, 207.19, 207.2, 202, 174

(56) References Cited

U.S. PATENT DOCUMENTS 3,855,525 * 12/1974 Bernin ................................... 324/34

* cited by examiner

*Primary Examiner*—Hezron Williams
*Assistant Examiner*—Anthony Jolly
(74) *Attorney, Agent, or Firm*—Jay H. Maioli

(57) ABSTRACT

A magnetic metal sensor having a high response speed and which can detect small-sized metal pieces and can elongate the separation from the metal pieces. A magnetic metal sensor 2 has a core 22 defining a substantially U-shaped open magnetic path and coils 23, 24 of the same polarity mounted on the core 22. A uniform magnetic field along the direction of magnetic sensitivity is applied by a magnet 25 across the coils 24, 24. If magnetic metal approaches to a open magnetic path portion of the core 22 of the magnetic metal sensor 2, the magnetic reluctance of the magnetic circuit formed by the core and air is changed, as a result of which the impedance of the cores 23, 24 is changed. The magnetic metal sensor 2 detects the possible presence of magnetic metal or its displacement based on impedance changes of the paired coils 23, 24.

7 Claims, 19 Drawing Sheets

2
3
11
1
λ
a1
a2
12
13 w1

11a SURFACE FOR DETECTION h1 w1=0.5mm
h1=2.0mm 1
11
12
a1
a2
3
40
13
λ
11

MAGNETIC METAL SENSOR AND METHOD FOR DETECTING MAGNETIC METAL

BACKGROUND OF THE INVENTION

1. Field of the Invention

This invention relates to a magnetic metal sensor for detecting a magnetic metal piece and a method for detecting magnetic metal using the magnetic metal sensor. As an example, the present invention relates to a magnetic metal sensor for detecting the possible presence of a magnetic metal piece or its displacement, a magnetic metal sensor for detecting a plurality of magnetic metal pieces from a unit under detection comprised of the magnetic metal pieces arranged side-by-side at a pre-set separation from one another.

2. Related Art

There has hitherto been known an eddy-current type sensor as a magnetic metal sensor for detecting the possible presence or displacement of magnetic metal.

This type of the magnetic metal sensor is desired to be used in a system, such as a machine tool for detecting the number of teeth of a gear for controlling the rpm of the rotational angle of the gear, or in a system for detecting the number of teeth used for knitting fibers in a knitting machine for cloths or chemical fibers for controlling the movement positions of the knitting bar of a comb-shaped knitting bar.

The magnetic metal sensor is also desired to be used in a system for judging whether or not a robot arm, for example, has approached a pre-set position to control the arm position, or in a system for detecting the slack or failure in tightening of a screw mounted on a work in order to check the operating process.

Meanwhile, the magnetic metal sensor of the eddy-current system is usually low in response rate. Thus, with the magnetic metal sensor of the eddy-current sensor, it has been difficult to detect a metal piece moved at an elevated speed or plural metal pieces paced side-b-side.

Also, the magnetic metal sensor of the eddy-current system is suddenly lowered in output level if the metal piece being detected is smaller in size than the coil making up the sensor. Thus, with the magnetic metal sensor of the eddy current system, it has been difficult to detect metal pieces of small sizes.

In addition, with the eddy-current type magnetic metal sensor, since the eddy current needs to flow through the metal piece by magnetic induction, the magnetic field applied from the coil to the metal piece needs to be sufficiently large to render it difficult to provide a sufficient distance between the coil and the metal piece.

By the above reason, it has been difficult to apply the eddy-current type magnetic metal sensor to a system for controlling the system for a machine tool or a system for controlling the destination of movement.

SUMMARY OF THE INVENTION

It is an object of the present invention to provide a magnetic metal sensor which is high in response speed and capable of detecting a metal piece of a small size and of increasing the separation thereof from the metal piece.

It is another object of the present invention to provide a magnetic metal sensor capable of detecting plural magnetic metal pieces arranged side-by-side at a pre-set separation λ and which is high in the response rate while being capable of detecting a metal piece of a small size and increasing the separation thereof from the metal piece.

It is still another object of the present invention to provide a magnetic metal sensor adapted for detecting plural metal pieces arranged side-by-side and for detecting magnetic metal pieces lying proximate to the sensor.

It is yet another object of the present invention to provide a method for detecting plural magnetic metal pieces arranged side-byside at a pre-set separation λ which is high in the response rate and which is capable of detecting a metal piece of a small size and increasing the separation thereof from the metal piece.

In one aspect, the present invention provides a magnetic metal sensor including a pair of coils energized by the current of a pre-set frequency for generating the magnetic field in a pre-set direction, a core formed of a high magnetic permeability material having a first portion, a second portion and a third portion, magnetic field generating means for applying to the core a magnetic field along the direction parallel to the magnetic field generated by the paired coils and detection means for detecting from the paired coils the magnetic field which is varied by magnetic metal approaching to an open magnetic path portion of the core. The core constitutes an open magnetic path in its entirety. The first portion carries one of the paired coils, the second portion carries the other coil and the third portion interconnects one ends of the first and second portions along the direction parallel to the direction of the magnetic field generated by the paired coils.

In the magnetic metal sensor, as magnetic metal approaches to the open magnetic path portion of the core, the magnetic circuit defined by the core and air is varied in magnetic reluctance to cause variations in the impedance of the paired coils. Based on changes in impedance of the paired coils, the magnetic metal sensor detects the possible presence of magnetic metal or its displacement. based on variations in the impedance of the paired coils.

In another aspect, the present invention provides a magnetic metal sensor including a pair of magnetic impedance effect (MI) devices fed with the current of a pre-set frequency, magnetic field generating means for applying to the paired MI devices a magnetic field along the direction parallel to the direction of the supplied current, and detection means for detecting from the paired MI devices the magnetic field varied by magnetic metal approaching the paired MI devices.

If, in the magnetic metal sensor, magnetic metal approaches to the paired MI devices, the magnetic circuit defined by the MI devices and air is changed in magnetic reluctance to change the impedances of the paired MI devices. The magnetic metal sensor detects the possible presence or displacement of magnetic metal based on impedance changes of the paired MI devices.

In still another aspect, the present invention provides a magnetic metal sensor moved relative to a unit under detection comprised of a plurality of magnetic metal pieces arrayed side-by-side at a pre-set interval λ along the direction of side-by-side arraying of the magnetic metal pieces for detecting the magnetic metal pieces, in which the sensor includes a pair of magneto-electric conversion units each having a magnetically sensitive portion which responds to variations in the magnetic field along the direction of magnetic sensitivity and magnetic field generating means for applying the magnetic field along the direction of magnetic sensitivity to the magnetically sensitive portions of the paired magneto-electric conversion units. The magnetically sensitive portions are provided in the paired magneto-electric conversion units so that the magnetically sensitive portions is of the same polarity and so that the direction of magnetic sensitivity is perpendicular to the direction of side-by-side arraying of the magnetic metal pieces. The magnetically sensitive portions are provided so that the separation g' between neighboring magnetic metal pieces along the movement direction is given by:

$$g'=(n+1/2)\lambda$$

where $\lambda$ is the above-defined pre-set interval and n is an integer not less than 0.

With the present magnetic metal sensor, the magnetically sensitive portions are sequentially responsive to the magnetic metal pieces arranged side-by-side. If the magnetically sensitive portion of one of the magneto-electric conversion units responds to one of the magnetic metal pieces, the magnetically sensitive portion of the other magneto-electric conversion unit responds to none of the magnetic metal pieces. Thus, with the present magnetic metal sensor, the difference of detection signals of the paired magneto-electric conversion units is deflected on the plus and minus sides about the value of the difference of the detection signals in the absence of response of both magneto-electric conversion units as center. The magnetic metal sensor detects the position of relative movement from the member under detection based on the difference of the detection signals of the paired magneto-electric conversion units.

In still another aspect, the present invention provides a magnetic metal sensor including a pair of magneto-electric conversion units each having a magnetically sensitive portion which responds to variations in the magnetic field along the direction of magnetic sensitivity, magnetic field generating means for applying the magnetic field along the direction of magnetic sensitivity to the magnetically sensitive portions of the paired magneto-electric conversion units and switching means for switching the polarity in the direction of magnetic sensitivity of one of the magnetically sensitive portions of the paired magneto-electric conversion units.

Responsive to the switching of the switching means, the magnetic metal sensor is moved relative to the member under detection comprised of plural magnetic metal pieces arrayed side-by-side at a pre-set interval for detecting the number of magnetic metal pieces or the approaching state to the magnetic metal pieces.

In yet another aspect, the present invention provides a method for detecting magnetic metal for detecting a plurality of magnetic metal pieces arrayed side-by-side at a pre-set interval, in which the method includes arraying a magnetic metal sensor having a pair of magneto-electric conversion units in turn having magnetically sensitive devices responding to variations in the magnetic field along the direction of magnetic sensitivity and a magnetic field generator for applying a magnetic field along the direction of magnetic sensitivity to the magnetically sensitive devices of the paired magneto-electric conversion units, so that the direction of magnetic sensitivity of the magnetically sensitive devices is perpendicular to the side-by-side arraying direction of the magnetic metal pieces and so that the magnetically sensitive devices are of the same polarity. The magnetically sensitive devices are arrayed so that the separation g' between neighboring magnetically sensitive devices will be given by $$g'=(n+1/2)\lambda$$

where n is an integer not less than 0.

The method also includes moving the magnetic metal sensor along the side-by-side arraying direction of the magnetic metal pieces, detecting detection signals of the paired magneto-electric conversion units and comparing detection signals from the paired magneto-electric conversion units for detecting the magnetic metal pieces.

With the method for detecting magnetic metal, the magnetic metal sensor is moved relative to the plural magnetic metal pieces, arranged side-by-side, so that the magnetically sensitive devices are sequentially sensitive to the magnetic metal pieces, arranged side-by-side. If the magnetically sensitive device of one of the magneto-electric conversion units responds to one of the magnetic metal pieces, the magnetically sensitive device of the opposite side magneto-electric conversion unit is responsive to none of the magnetic metal pieces. Therefore, with the present magnetic metal detection method, the difference of the detection signals of the paired magneto-electric conversion units is deviated on the plus and minus sides of the difference of the detection signals that is produced when none of the magnetically sensitive devices is responding to the magnetic metal pieces. With the present magnetic metal detection method, plural magnetic metal pieces arrayed side-by-side at an interval $\lambda$ is detected based on the difference of the detection signals of the paired magneto-electric conversion units.

DESCRIPTION OF PREFERRED EMBODIMENTS

Figure 1:
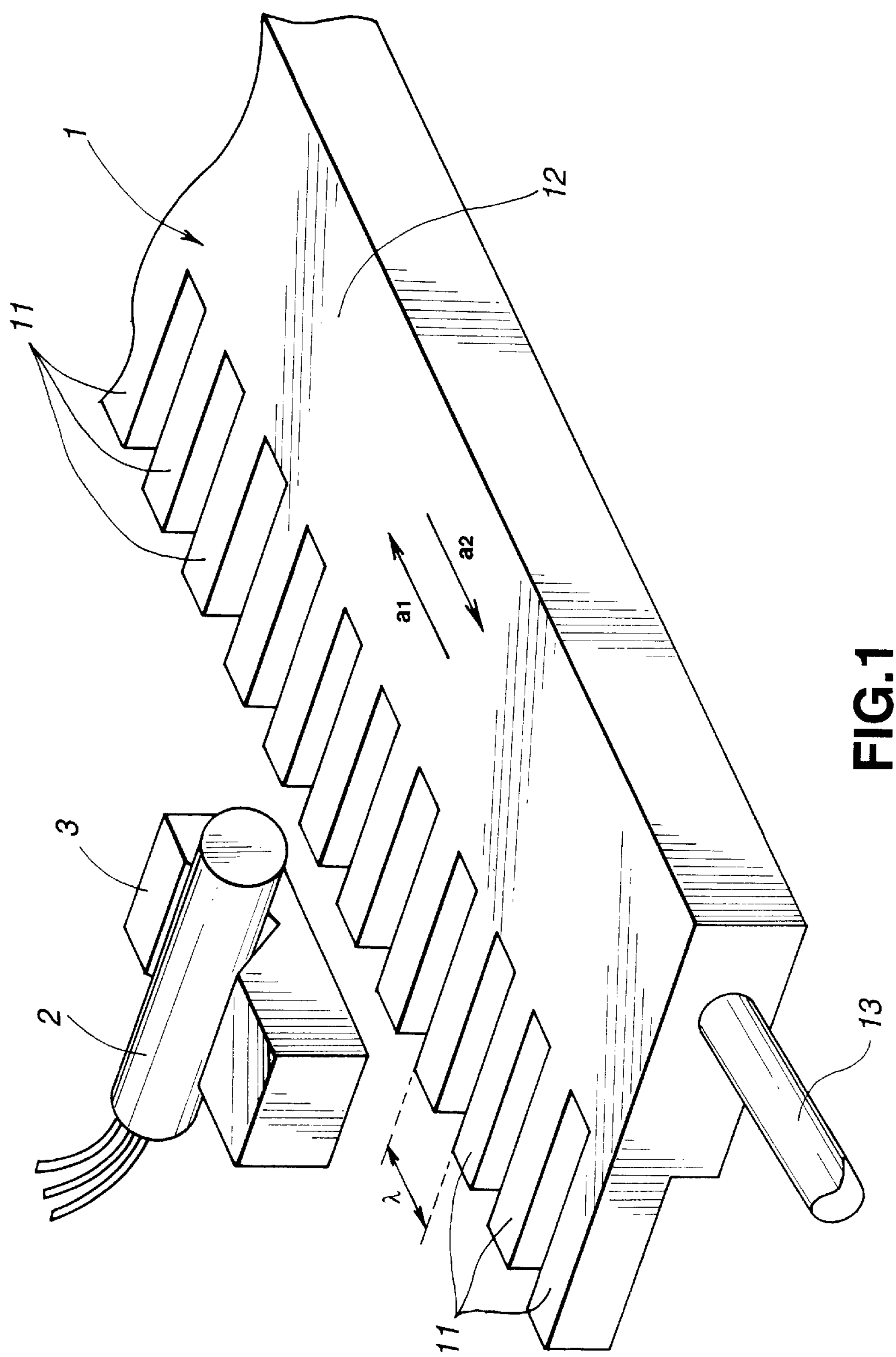
FIG. 1 is a perspective view showing a metal piece counter employing a first embodiment of a magnetic metal sensor.

Referring to the drawings, preferred embodiments (first and second embodiments) of the magnetic metal sensor of the present invention will be explained in detail.

FIG. 1 shows a perspective view of a metal piece counter employing a magnetic metal sensor of the first embodiment of the present invention. This metal piece counter detects the position of movement of a member under detection having its plural magnetic metal pieces arranged side-by-side at pre-set separation from one another.

Referring to FIG. 1, the metal piece counter is made up of a member under detection 1 and a magnetic metal sensor 2 secured to a sensor support block 3.

The member under detection 1 includes a plurality of metal pieces 11 arrayed side-by-side at a pre-set separation λ from one another. These metal pieces 11 are formed of magnetic metal, such as iron, and are parallelepipedic in shape. These metal pieces 11 have one longitudinal ends secured to an indicator 12 to constitute together the member under detection 1.

Figures 2, 3:
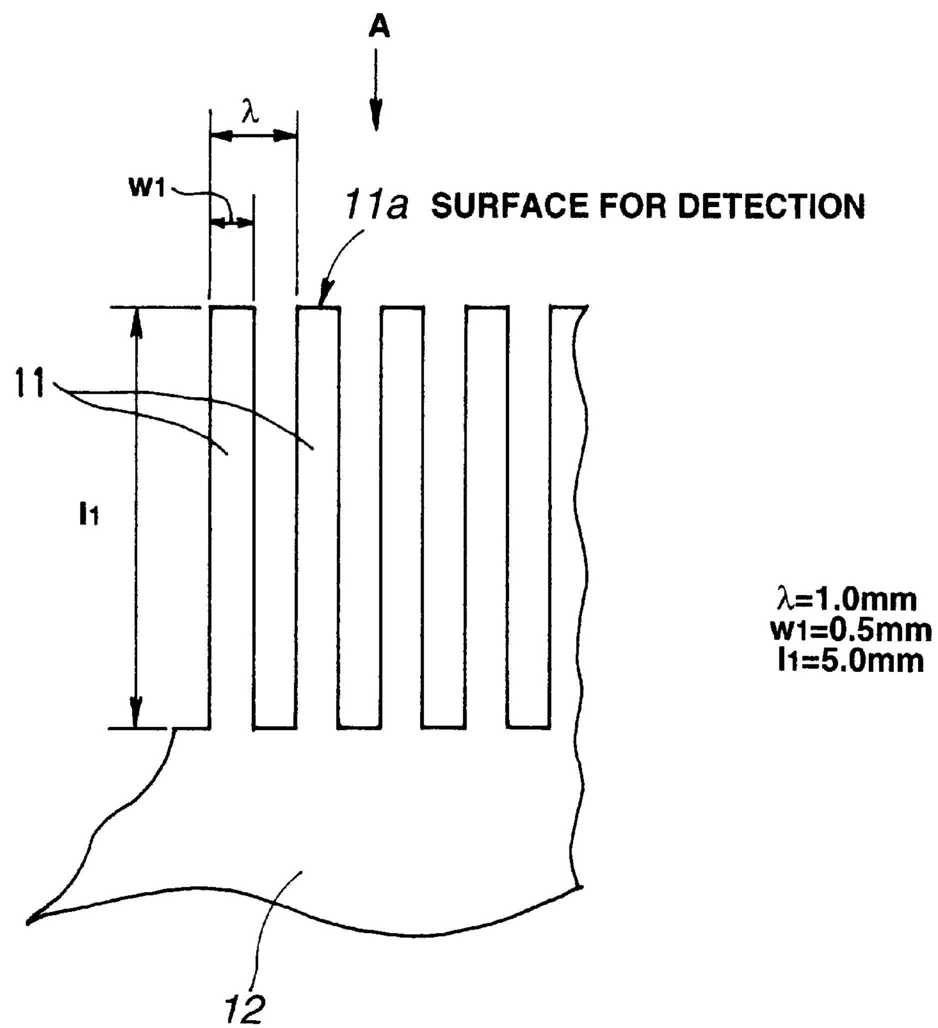
FIG. 2 is a plan view showing essential portions of a member under detection of the metal piece counter.
FIG. 3 is a side view of a metal piece of the member under detection of the metal piece counter.

Referring to the plan view of FIG. 2 and the side view of FIG. 3 looking from the direction A of FIG. 2, the length l1, width w1 and the height h1 of each metal piece 11 are 5.0 mm, 0.5 mm and 2.0 mm, respectively. The separation λ of the metal pieces 11 is 1.0 mm. The lateral side of the metal piece 11 looking from the direction A shown in FIG. 2, that is the lateral side on the end of the metal piece 11 opposite to the end mounted on the indicator 12, is herein termed a surface under detection 11*a*.

The lateral side of the indicator 12 of the member under detection 1 carries a driving shaft 13 connected to a driving unit, not shown, adapted for moving the member under detection 1 by translating movement in the direction indicated by arrows $a_1$ and $a_2$, corresponding to the arraying direction of the metal pieces 11, under control by a driving circuit, also not shown.

Figure 4:
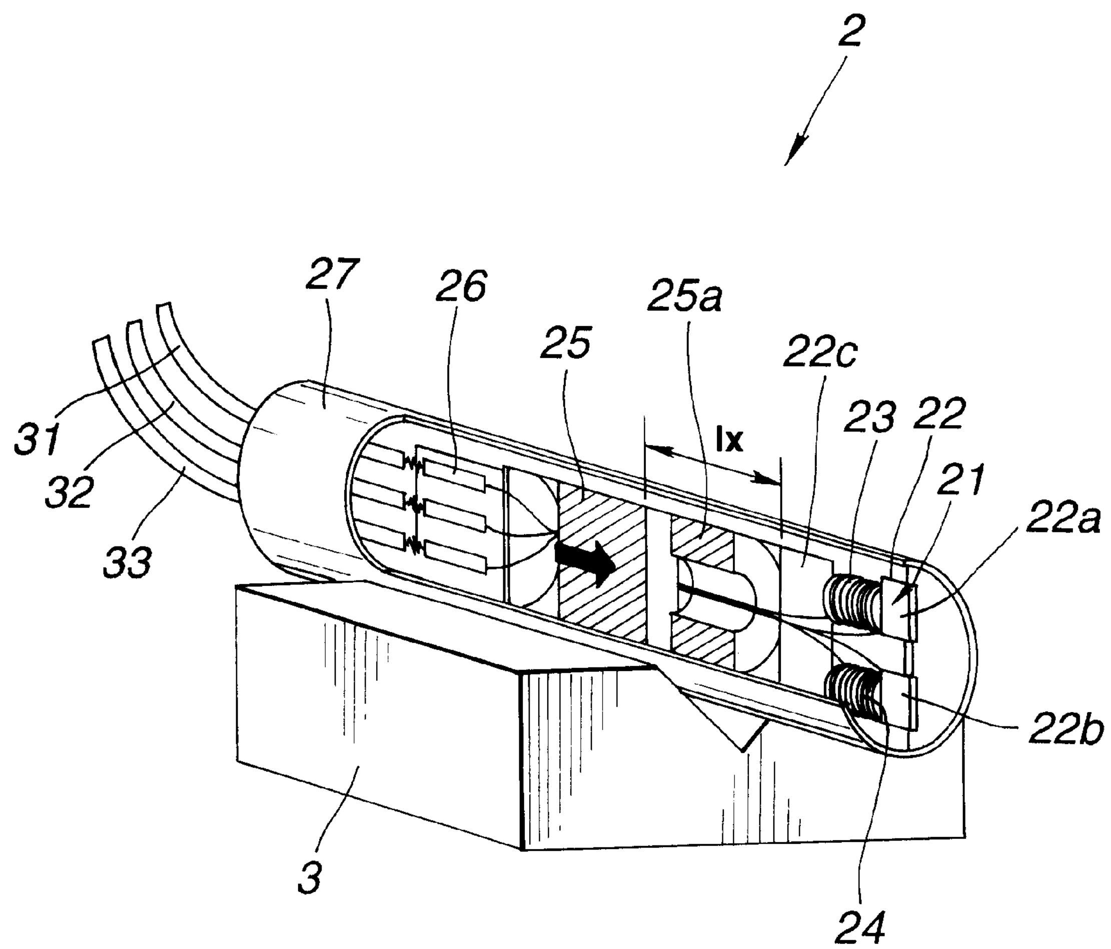
FIG. 4 is a partial cross-sectional view of the magnetic metal sensor of the metal piece counter.

FIG. 4 shows the structure of the magnetic metal sensor 2.

The magnetic metal sensor 2 includes a magnetically sensitive unit 21, comprised of a substantially U-shaped open magnetic path type core 22 and coils 23, 24 wrapped thereon, and a magnet 25 for applying a magnetic field to the magnetically sensitive unit 21.

Figure 5:
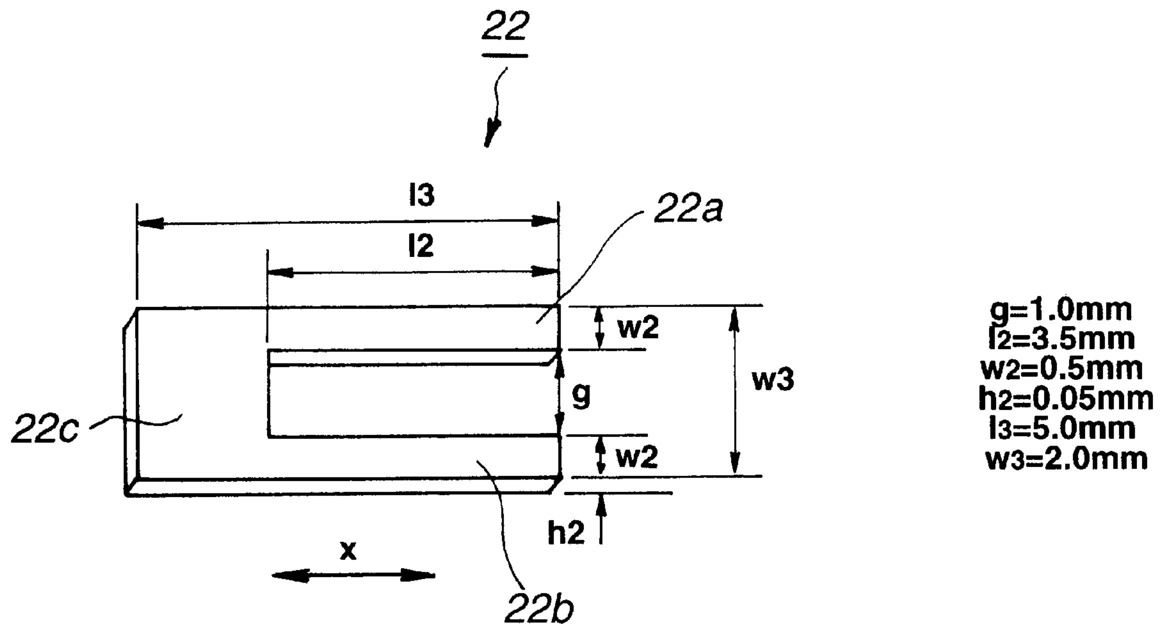
FIG. 5 shows the shape of a core of a magnetically sensitive portion provided on the magnetic metal sensor.

The core 22 of the magnetically sensitive unit 21 includes substantially parallelepipedic extensions 22*a*, 22*b* arranged parallel to each other with a pre-set gap width $_g$, as shown in FIG. 5. These extensions 22*a*, 22*b* have one longitudinal ends connected integrally to a web 22*c* to constitute together the substantially U-shaped core 22. This core 22 is formed of a soft magnetic material, such as amorphous material, e.g., Permalloy of the NiFe composition or Fe, Co, Si and B.

The core 22 is sized so that the length l2, width w2 and the height h2 of each of the extensions 22*a*, 22*b* are 3.5 mm, 0.5 mm and 0.05 mm, respectively. The gap width g between the extensions 22*a*, 22*b* is 1.0 mm, with the length l3, width w3 and the height h2 of the core 22 in its entirety being 5.0 mm, 2.0 mm and 0.05 mm, respectively.

Figure 6:
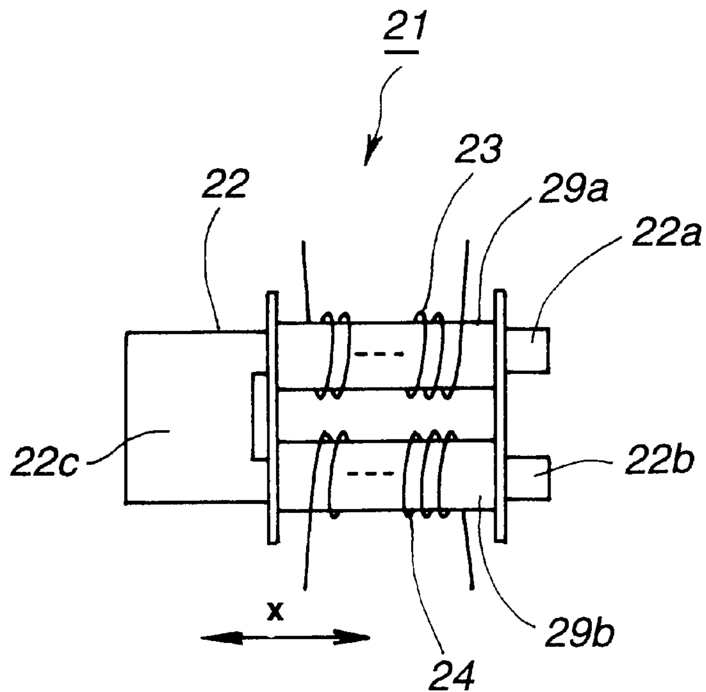
FIG. 6 shows the magnetically sensitive portion having a coil wrapped around the core.

The coils 23, 24 are wrapped about the extensions 22*a*, 22*b* of the core 22, using the outer peripheral surfaces of tubular bobbins 29*a*, 29*b* as guides, as shown in FIG. 6. These coils 23, 24 are wrapped so that the center axes thereof run parallel to the longitudinal direction of the extensions 22*a*, 22*b*. The coils 23, 24 are each comprised of 50 turns of a copper wire 0.05 mm in diameter.

The above-described magnetically sensitive unit 21 exhibits extremely high sensitivity to the external magnetic field entering the magnetically sensitive unit 21 in a direction parallel to the longitudinal direction of the extensions 22*a*, 22*b* of the core indicated x in FIG. 5. The magnetically sensitive unit 21 also undergoes impedance changes at an extremely large rate of change with respect to the external magnetic field applied to the magnetically sensitive unit 21 in a direction parallel to the direction x. This longitudinal direction of the extensions 22*a*, 22*b* of the core 22, that is the direction x n FIG. 5, is referred to herein as the magnetically sensitive direction of the magnetically sensitive unit 21.

The coils 23, 24 of the magnetically sensitive unit 21 are energized with the high frequency pulse current. It should be noted that the winding directions of the coils 23, 24 and the flowing direction of the energizing high frequency pulse current are selected so that the magnetic field generated by the coils 23, 24 are of opposite polarities to each other. That is, the magnetic field Hi generated in the coil 23 is opposite in direction to the magnetic field H1' generated in the coil 24. If, for example, the winding direction of the coil 23 is the same as that of the coil 24, these coils 23, 24 are energized by the reverse-phased high frequency pulse currents, whereas, if the winding direction of the coil 23 is opposite to that of the coil 24, these coils 23, 24 are energized by the co-phased high frequency pulse currents.

These coils 23, 24 are connected on a terminal block 26 to signal lines 31, 32, 33 via which the coils are connected to a driving detection circuit 30 provided outside of the magnetic metal sensor 2. The energizing current is fed to the coils 23, 24 from the driving detection circuit which then detects an output.

Figure 7:
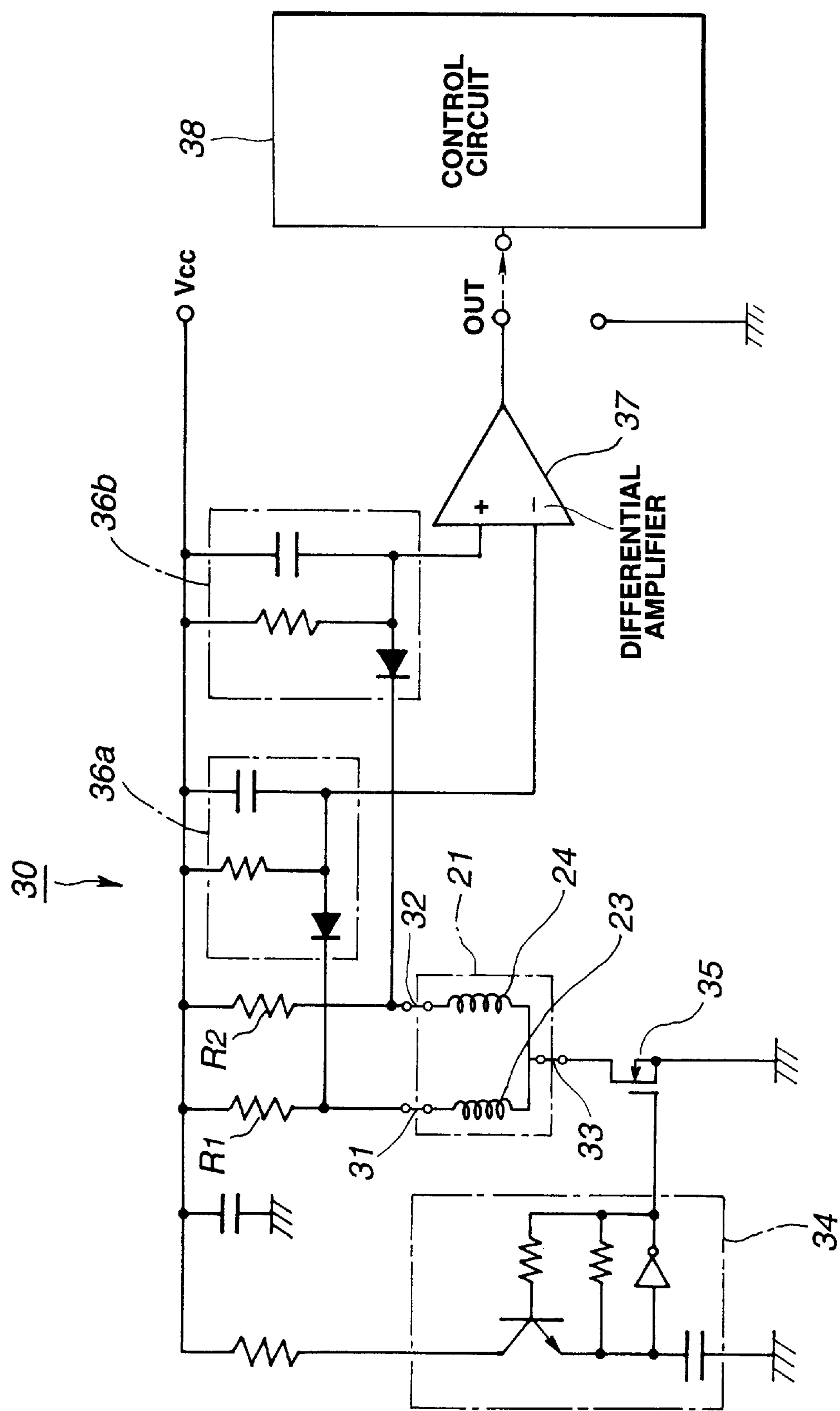
FIG. 7 is a circuit diagram showing a driving detection circuit of the magnetic metal sensor.

FIG. 7 shows the circuit diagram of the driving detection circuit 30.

The driving detection circuit 30 includes an oscillation circuit 34, a switching circuit 35 for switching between driving currents of the coils 23, 24 based on pulse signals from the oscillation circuit 34, a smoothing circuit 36*a* for detecting and smoothing an output voltage of the coil 23, a smoothing circuit 36*b* for detecting and smoothing an output voltage of the coil 24 and a differential amplification circuit 37 for amplifying the difference between smoothed output voltages of the coils 23, 24.

The coils 23, 24 are connected in parallel as shown in FIG. 7. The coil 23 has its one end fed with the source voltage Vcc via resistor R1 and has its other end grounded via switching circuit 35. The coil 24 has its one end fed with the source voltage Vcc via resistor R2 of the same resistance magnitude as the resistor R1 and has its other end grounded via switching circuit 35. The coils 23, 24 have respective detection outputs retrieved at the junction points to the resistors r1 and recording head control circuit 2, respectively.

The oscillation circuit 34 generates pulse signals with a frequency of 1 MHz and a duty ratio of 1:10. Based on these pulse signals, the switching circuit 35 switches between the currents flowing in the parallel-connected coils 23, 24. This energizes the coils 23, 24 with the high frequency pulse current.

The smoothing circuit 36*a* detects the voltage at the junction between the coil 23 and the resistor RI for smoothing the detected voltage. On the other hand, the smoothing circuit 36*b* detects the voltage at the junction between the coil 24 and the resistor R2 for smoothing the detected voltage.

The differential amplification circuit 37 detects the differential voltage between the output voltage of the coil 23 smoothed by the smoothing circuit 36*a* and the output voltage of the coil 24 smoothed by the smoothing circuit 36*b* to produce an amplified differential signal which is fed to a control circuit 38.

The control circuit 38 detects the signal supplied from the differential amplification circuit 37 to convert the signal into bi-level signals at a pre-set threshold level to find the number of detected metal pieces 11. Thus, the control circuit 38 can detect the position of relative movement between the magnetic metal sensor 2 and the member under detection 1 by counting the number of the metal pieces 11. Also, the control circuit 36 can detect the separation between the metal pieces 11 and the magnetic metal sensor 2 by detecting the level of the signal supplied from the differential amplification circuit 37.

Thus, the driving detection circuit 30 can energize coils 23, 24 with the high frequency pulse current. The driving detection circuit 30 energizes the coils 23, 24 so that the magnetic field H1 generated by the coil 23 and the magnetic field H2 generated by the coil 24 will be reverse-phased relative to each other. The driving detection circuit 30 also can detect a differential output of the output voltages of the coils 23, 24.

The magnet 25 is positioned and secured by a positioning portion 25*a* at a pre-set separation from the magnetically sensitive unit 21 in order to apply to the magnetically sensitive unit 21 a uniform magnetic field parallel to the magnetically sensitive direction. This magnet 25 is mounted facing the web 22*c* of the magnetically sensitive unit 21 in order to apply to the magnetically sensitive unit 21 the magnetic field parallel to the magnetically sensitive direction from the web 22*c* of the core 22. For example, the magnet 25 is a parallelepipedic ferrite magnet 1×1×2 mm in size and is arranged so that its 1×2 mm surface will face the web 22*c* of the magnetically sensitive unit 21. In this case, the magnet 25 is magnetized to the surface magnetic flux density of approximately 600G in a direction perpendicular to the 1×2 mm surface. The magnet 25 may be arranged with its N-pole side or S-pole side facing the web 22*c* if only the uniform magnetic field parallel to the magnetically sensitive direction is applied across the magnetically sensitive unit 21.

The distance 1*x* between the magnetically sensitive unit 21 and the magnet 25 is determined depending on the strength of the magnet 25 and impedance characteristics of the m21 with respect to the magnetic field. Specifically, a magnetic field proper to the magnet 25 is applied across both coils 23, 24 in order to detect the maximum value of the differential output of the coils 23, 24 (such as the differential output at the most proximate position of the magnet 25 to the web 22*c* of the core 22) and the minimum value of the differential output of the coils 23 and 24 (such as the differential output when the magnet 25 is infinitely remote from the web 22*c* oft the core 22. Such a position s found at which the differential output is intermediate between these detected values and the distance at this time between the magnetically sensitive unit 21 and the magnet 25 is determined as the distance 1*x*. In the above magnetically sensitive unit 21 and the magnet 25, this distance 1*x* may be set at 2 mm.

The magnet 25 may also be a Sm-based or ZnMn-based permanent magnet or an electromagnet, instead of a ferrite magnet. If the electro-magnet is used as the magnet 25, the generated magnetic field can be controlled by the current magnitude, so that the adjustment of the distance 1*x* may be made in dependence upon this current value.

The above-described magnet 25 can apply the bias magnetic field in the magnetically sensitive direction to the magnetically sensitive unit 21. Therefore, the magnetically sensitive unit 21 can be used in an area in which impedance changes relative to the magnetic field 21 are linear and exhibit steep characteristics.

The magnetically sensitive unit 21, comprised of the substantially U-shaped open magnetic path type core 22 about which are wrapped the coils 23, 24 and the magnet 25 for applying the magnetic field in the magnetically sensitive direction to the magnetically sensitive unit 21, is accommodated in an aluminum casing 27, along with an epoxy resin sealed together therein for protection, in order to constitute together the magnetic metal sensor 2.

The magnetic metal sensor 2 described above has the magnetically sensitive unit 21 having the core 22 defining the open magnetic path, and the magnetic field in the magnetically sensitive direction is applied by the magnet 25 to the magnetically sensitive unit 21. On the core 22 of the magnetically sensitive unit 21 are mounted the coils 23, 24 which are arranged parallel to each other so that the generated magnetic fields generated therein as a result of energization will be opposite in polarity. Thus, if magnetic metal approaches the coils 23, 24 wrapped about the core 22, the magnetic field generated by the magnet 25 is disturbed and changed. Since the coils 23, 24 of the magnetic metal sensor 2 are energized so as to be reversed in polarity, the difference in impedance between the coils 23, 23 is varied responsive to the separation thereof from the approaching magnetic metal. Therefore, the distance of the sensor from the metal piece 11 can be detected by detecting the differential voltage across the coils 23, 24.

The relative disposition between the member for detection 1 and the magnetic metal sensor 2 is explained.

The member under detection 1 is moved by the driving unit in translation in the direction indicated by arrow $a_1$ and $a_2$ in FIG. 1, that is in the side-by-side arraying direction of the metal pieces 11, as described above, while the magnetic metal sensor 2 is stationarily mounted on a sensor mounting block 3. If the member under detection 1 is moved in translation relative to the side-by-side arraying direction of the metal pieces 11, the magnetic metal sensor 2 is mounted so that each metal piece 11 has its surface under detection 11*a* faced by an opening of the U-shaped core 22 of the magnetically sensitive unit 21. That is, the magnetic metal sensor 2 is arranged so that the direction of magnetic sensitivity of the magnetically sensitive unit 21 (direction x in FIG. 5) coincides with the longitudinal direction of the metal pieces 11 and perpendicular to the movement directions a1, a2 of the member under detection 1.

Figure 8:
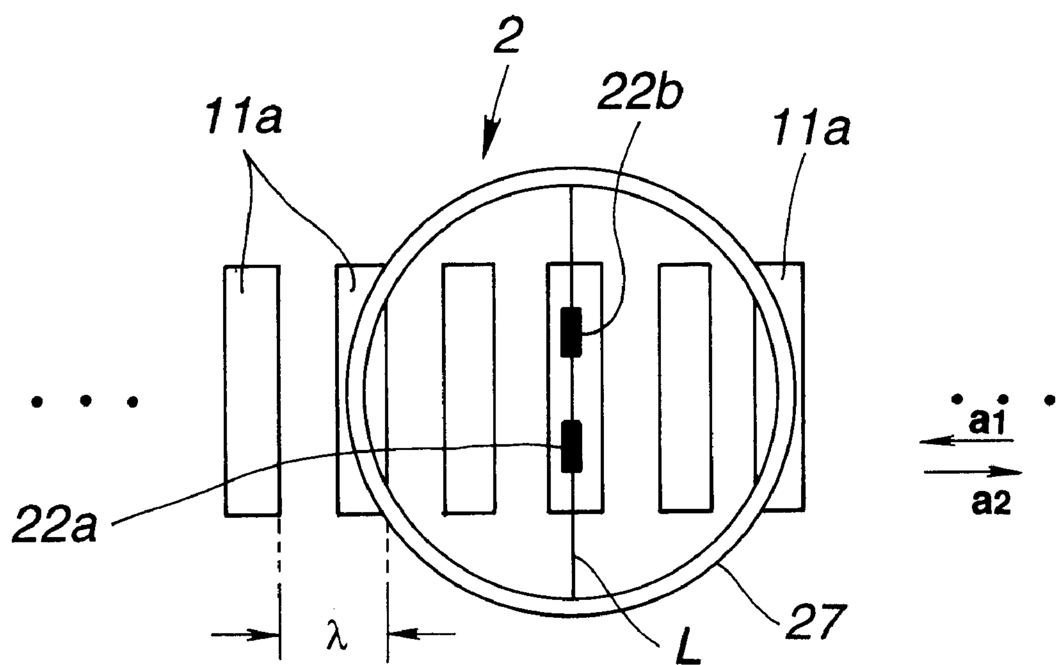
FIG. 8 shows the relative disposition of the member under detection and the magnetic metal sensor.
Figure 9:
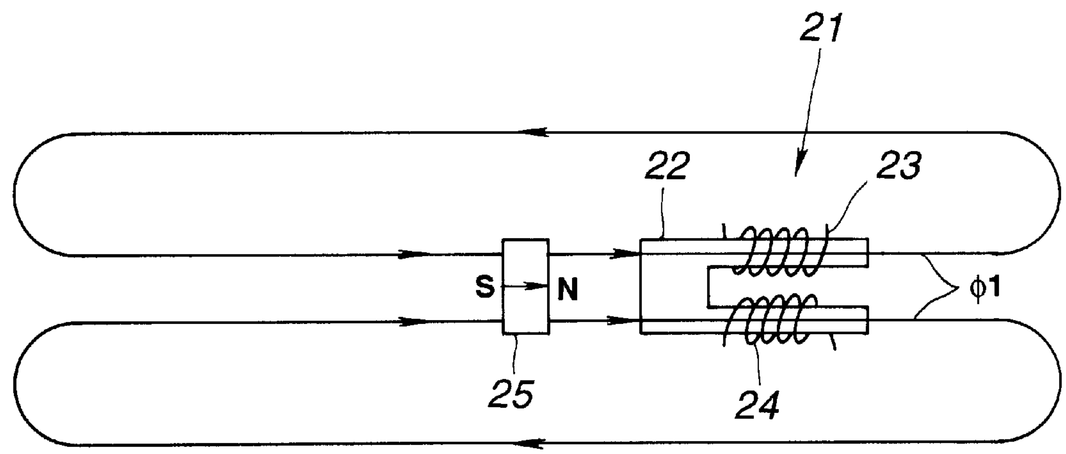
FIG. 9 illustrates a magnetic circuit formed in case the metal piece is not proximate to the magnetic metal sensor.
Figure 10:
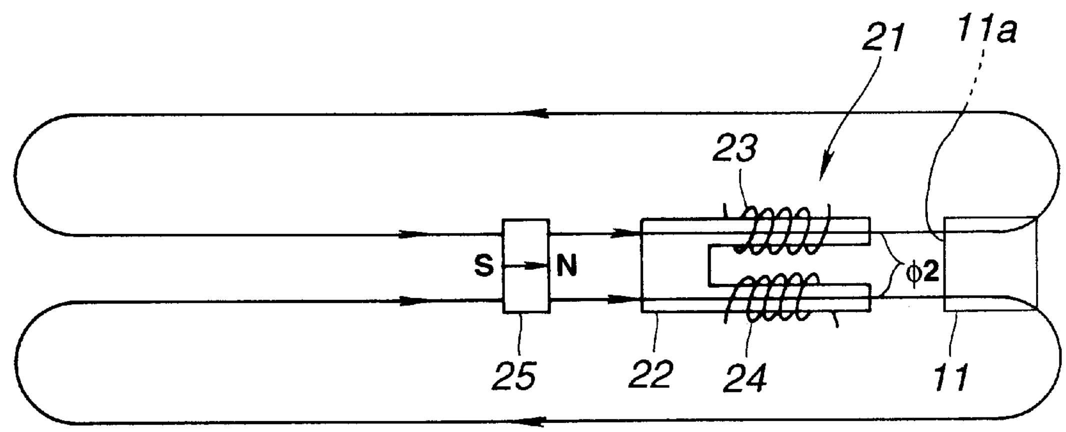
FIG. 10 illustrates a magnetic circuit formed in case the metal piece is proximate to the magnetic metal sensor.

The magnetic metal sensor 2 also is arranged so that a straight line L interconnecting the extensions 22*a* and 22*b* of the magnetically sensitive unit 21 will be perpendicular relative to the movement directions a1, a2 of the member under detection 1, as shown in FIG. 8.

By setting the relative disposition between the member under detection 1 and the magnetic metal sensor 2 as described above, a detection output of the magnetic metal sensor 2 repeats the following state: That is, the magnetic metal sensor 2 repeats the state in which the opening of the U-shaped core 22 is facing the surface under detection 11*a* of one of the metal pieces 11 and the state in which the opening of the U-shaped core 22 is not facing the surfaces under detection 11*a* of the metal pieces 11. Thus, the detection output of the magnetic metal sensor 2 is such that the differential voltage across the coils 23, 24 is repeatedly increased or decreased about the pre-set threshold voltage as center.

Thus, with the magnetic metal sensor 2, the movement position of the member under detection 1 can be detected by converting the differential voltage alternately increased and decreased responsive to relative movement between the sensor and the member under detection 1 into bi-level signals with a pre-set threshold voltage and by counting the results of the bi-level conversion.

The operation of detecting the metal pieces 11 of the magnetic metal sensor 2 is hereinafter explained.

First, the detection output of the magnetic metal sensor 2 in case a sole metal piece 11 is moved from the coil 23 to the coil 24 of the magnetic metal sensor 2 is explained with reference to FIGS. 9 to 12.

If the magnetic metal sensor 2 is not approaching to the metal piece 11, that is if the opening of the U-shaped core 22 is not facing the surface under detection 11*a* of the metal piece 11, the magnetic flux emanating from the magnetic field produced by the magnet 25 traverses the magnetic circuit made up of the core 22 and the ambient air. Since the magnetic permeability of air is small, the magnetic reluctance of the magnetic circuit in its entirety is increased. The amount of the magnetic flux traversing the magnetic circuit at this time is denoted as ψ 1.

Conversely, if the magnetic metal sensor 2 is approaching to the metal piece 11, that is if the opening of the U-shaped core 22 is facing the surface under detection 11*a* of the metal piece 11, the magnetic flux emanating from the magnetic field produced by the magnet 25 traverses the magnetic circuit made up of the core 22, the ambient air and the metal piece 11. Since the metal piece 11 is formed of magnetic metal and hence is of large magnetic permeability, the magnetic reluctance of the magnetic circuit in its entirety is decreased. The amount of the magnetic flux traversing the magnetic circuit at this time is denoted as ψ 2. Therefore, the magnetic flux ψ 2 is larger than the magnetic flux ψ 1.

The coils 23, 24 are energized with the high frequency pulse current for generating magnetic fields of different polarities. The magnetic flux traversing the coils 23, 24 is the sum of the magnetic flux produced on energization by this high frequency pulse current and that generated by the magnet 25. Therefore, the amount of the magnetic flux traversing the coil 23 differs from that traversing the coil 24 so that the impedance of the coil 23 differs from that of the coil 24.

Figure 11:
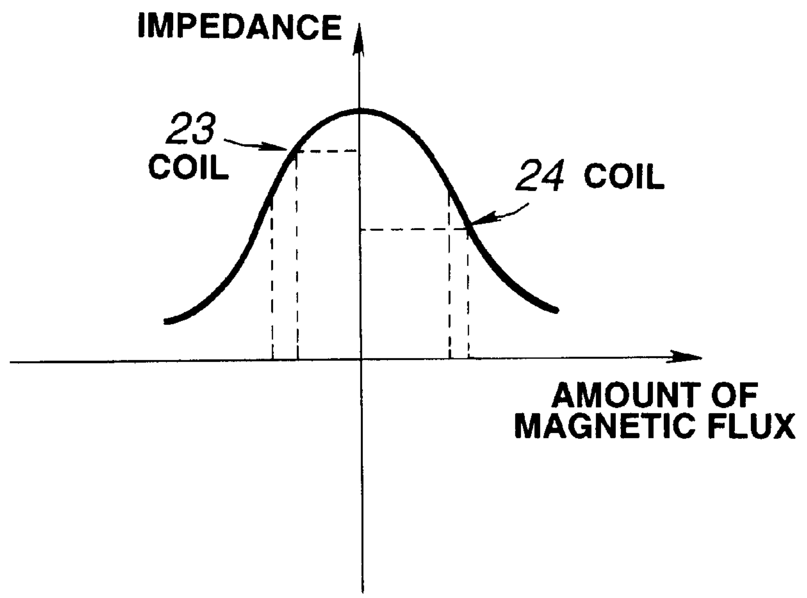
FIG. 11 illustrates the impedance of each coil when the metal piece is not proximate to the magnetic metal sensor.
Figure 12:
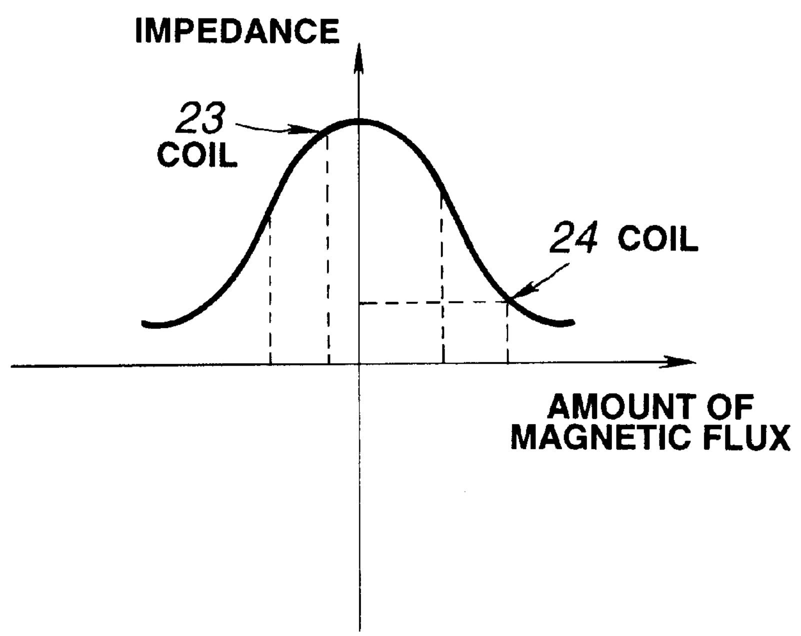
FIG. 12 illustrates the impedance of each coil when the metal piece is proximate to the magnetic metal sensor.

Thus, if the magnetic metal sensor 2 is not approaching to the metal piece 11, there is produced a difference between the value of the impedance of the coil 23 and that of the coil 24, as shown in FIG. 11. For example, the impedance of the coil 23 is larger than that of the coil 24. If the magnetic metal sensor 2 approaches to the metal piece 11 from this state, the magnetic flux through the coil generating the magnetic field of the same direction as the direction of the magnetic field produced by the magnet 25 is increased, while the magnetic flux through the coil generating the magnetic field reversed in direction from the magnetic field generated by the magnet 25 is decreased. The result is that the impedance of the coil 23 is increased, while that of the coil 24 is decreased. Thus, when the magnetic metal sensor 2 approaches to the metal piece 11, the difference between the impedance of the coil 23 and that of the coil 24 is much larger the difference between the difference between the impedance of the coil 23 and that of the coil 24 when the magnetic metal sensor 2 is not close to the metal piece 11, as shown in FIG. 12. For example, the impedance of the coil 23 is much larger than that of the coil 24.

Thus, the impedances of the coils 23, 24 are changed responsive to the distance of the magnetic metal sensor 2 from the metal piece 11. Therefore, with the magnetic metal sensor 2, the distance of the sensor from the metal piece 11 can be detected by detecting the voltage difference between the coils 23 and 24.

Figures 13A, 13B:
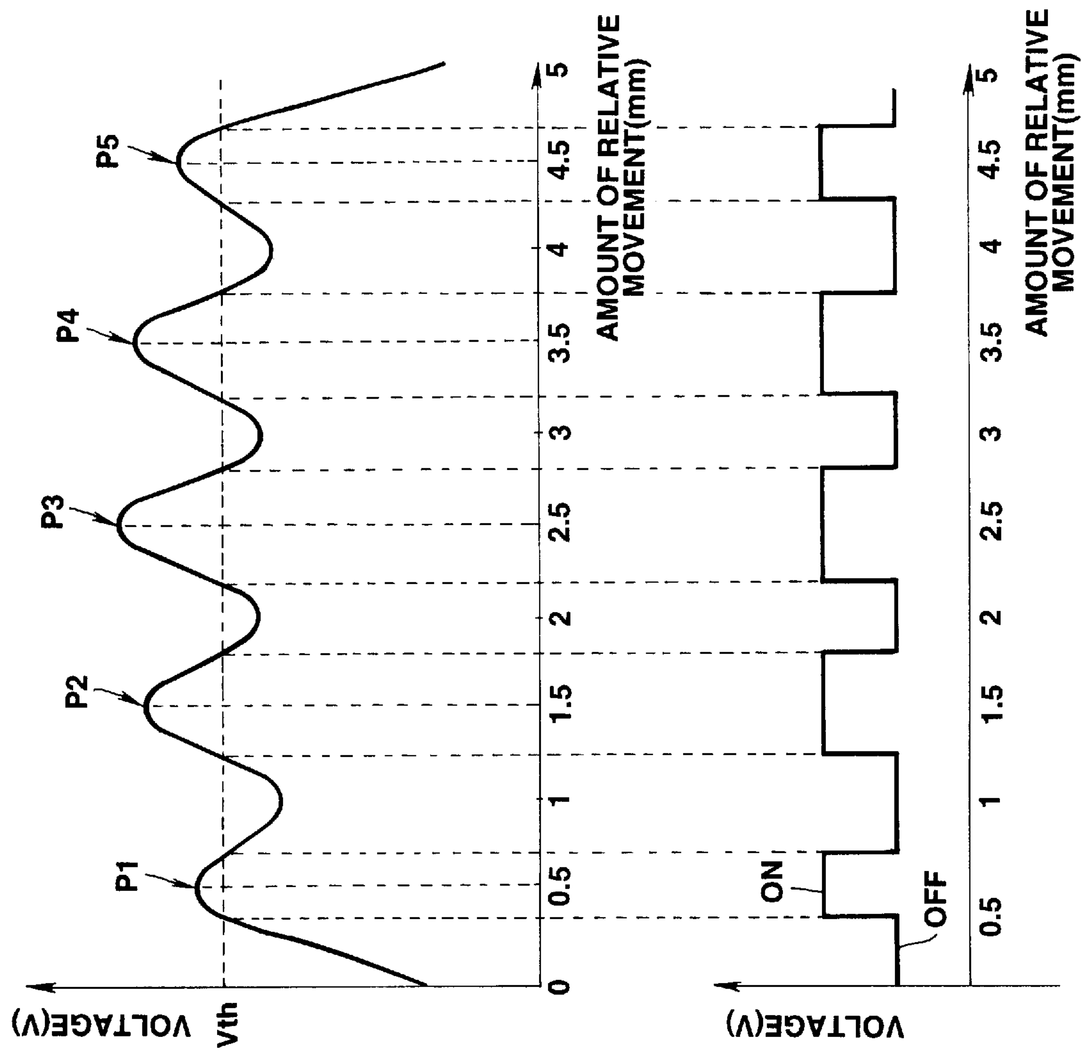
FIG. 13*a* illustrates the voltage level of an output signal of a driving detection circuit.
FIG. 13*b* illustrates the voltage level of a signal converted from the output signal of the driving detection circuit to a bi-level signal at a pre-set threshold level

Referring to FIGS. 13*a* and 13*b*, the detection output in case the magnetic metal sensor 2 is moved relative to plural metal pieces 11 arranged side-by-side with a separation λ relative to one another is explained. In these figures, the distance of relative movement of the magnetic metal sensor 2 to the plural metal pieces 11 is plotted on the abscissa in FIGS. 13*a* and 13*b*. FIGS. 13*a* and 13*b* show the voltage level of an output signal of a driving detection circuit 30 and the voltage level of a bi-level signal obtained on slicing the output voltage of the driving detection circuit 30 at a pre-set threshold level.

the magnetic metal sensor 2 is moved relative to the plural metal pieces 11 arranged side-by-side with a separation λ relative to one another, a differential voltage output between the voltage across the coil 23 and that across the coil 24 is spatially varied in voltage level, with the relative movement distance of 1 mm as a period, as shown in FIG. 13*a*. When the magnetic metal sensor 2 is facing the metal piece 11, this differential voltage output reaches a peak (p1 to p5) when the magnetic metal sensor 2 is facing a given metal piece 11.

By converting the differential voltage output between the voltage across the coil 23 and that across the coil 24 into bi-level signals at a pre-set threshold level Vth, on/off signals can be produced, as shown in FIG. 13*b*

By moving the magnetic metal sensor 2 relative to the plural metal pieces 11 arrayed side-by-side at a separation λ from one another, converting the differential voltage between the voltage across the coil 23 and that across the coil 24 into corresponding bi-level signals and counting the resulting bi-level signal, the position of movement of the member under detection 1 can be detected, as described above. Since the magnetic metal sensor 2 senses the distance from the metal piece 11 or the possible presence of the metal piece 11, based on changes in the amount of the magnetic flux due to the magnetic field emanating from the magnet 25, small-sized metal pieces 11 or thin metal pieces 11 can be detected without lowering the output level.

Also, since it suffices with the present magnetic metal sensor 2 to set the magnetic field emanating from the magnet 25 responsive to the separation thereof from the metal pieces 11, it is possible to increase the separation between the sensor and the metal pieces 11.

Moreover, if, with the magnetic metal sensor 2, another magnetic metal sensor is arranged with an offset of (m±1/4)λ, m being an integer, in the direction of relative movement from the magnetic metal sensor 2, a two-phase signal can be produced which is made up of the signal shown in FIG. 13*b* and the same signal having a phase difference of 90° relative thereto. Therefore, since a signal outputting the amount of relative movement can be produced based on this two-phase signal, a position detection unit can be constituted using the modified magnetic metal sensor 2.

A second embodiment of the magnetic metal sensor of the present invention is hereinafter explained. The parts and components which are the same as those of the first embodiment are depicted by the same reference numerals and the corresponding description is omitted for simplicity.

First, the magnetic metal sensor of the second embodiment, applied to a metal piece counter for detecting the movement position of the member under detection having the magnetic metal pieces arrayed side-by-side in a pre-set separation from one another, is explained with reference to the drawings.

Figure 14:
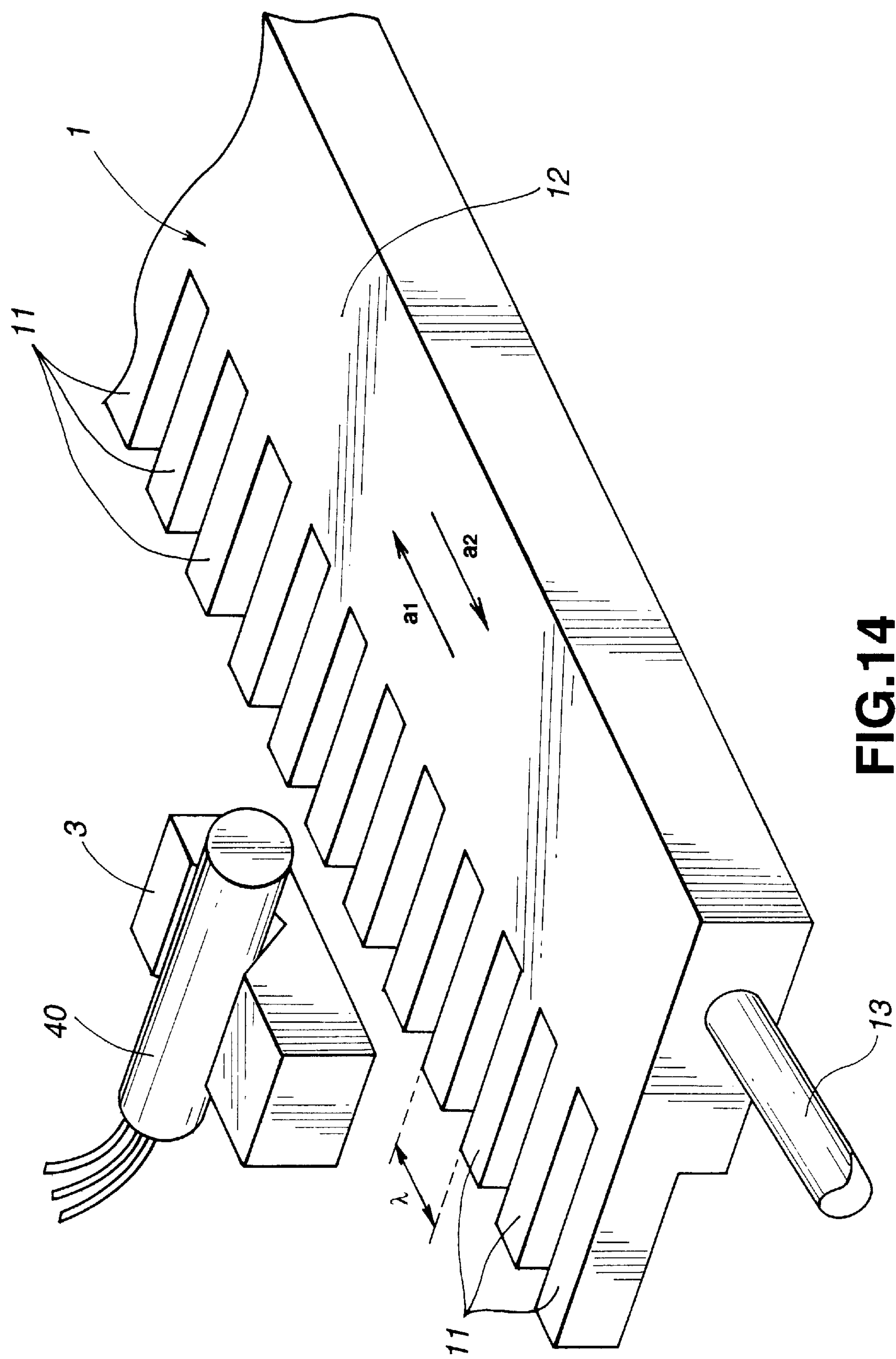
FIG. 14 is a perspective view of a metal piece counter employing the second embodiment of the magnetic metal sensor.

FIG. 14 shows a perspective view showing a metal piece counter.

The metal piece counter is made up of a member under detection 1 and a magnetic metal sensor 40 secured to the sensor mounting block 3.

Figure 15:
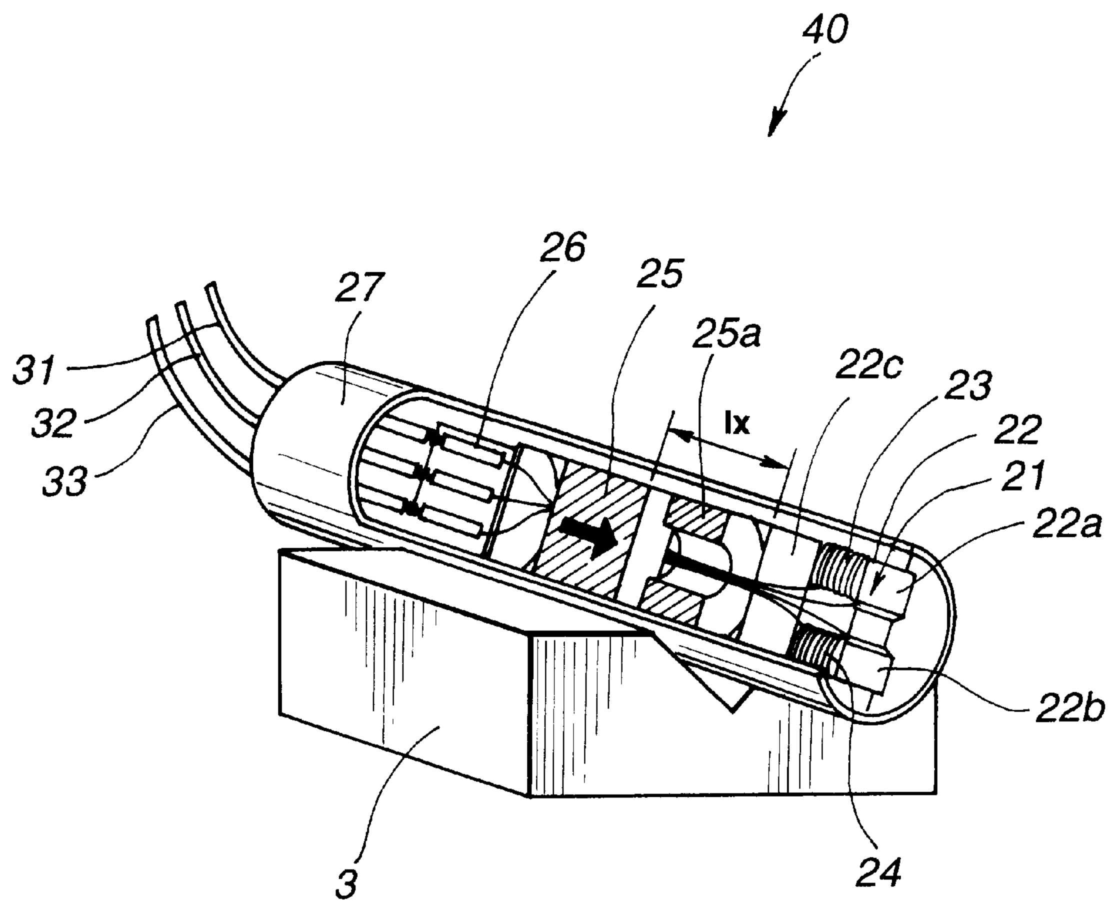
FIG. 15 is a partial cross-sectional view of a magnetic metal sensor of the metal piece counter.

FIG. 15 shows the structure of the magnetic metal sensor 40.

The magnetic metal sensor 40 is comprised of a magnetically sensitive unit having a substantially U-shaped open magnetic circuit type core 22, about which saree wrapped coils 23 and 24, and a magnet 25 for applying a magnetic field across the magnetically sensitive unit 21.

The magnetically sensitive unit 21 has an extremely high sensitivity to the external magnetic field applied parallel to the longitudinal direction of the extensions 22*a,* 22*b* of the core 22. The magnetically sensitive unit 21 also undergoes impedance changes of an extremely high rate of change against the external magnetic field applied in a direction parallel to the direction of magnetic sensitivity.

The coils 23, 24 of the magnetically sensitive unit 21 are energized with the high frequency pulse current. If the magnetic metal sensor 40 is applied to the metal piece counter, the winding direction of the coils 23, 24 and the current flow direction of the high frequency energizing pulse current are selected so as to have the same polarity, that is so that the magnetic field H1 generated in the coil 23 will be of the same direction as the magnetic field H1' generated in the coil 24. For example, if the winding direction of the coils 23, 24 is the same, these coils 23, 24 are energized by the high frequency pulse currents in-phase to each other. Conversely, if the winding direction of the coils 23, 24 is reversed relative to each other, these coils 23, 24 are energized by the high frequency pulse currents opposite in phase relative to each other.

If the magnetic metal sensor 40 is used as a proximity sensor, the winding direction of the coils 23, 24 and the current flow direction of the high frequency energizing pulse current are selected so as to have the opposite polarity, that is so that the magnetic field H1 generated in the coil 23 will be opposite in direction to the magnetic field H1' generated in the coil 24. For example, if the winding direction of the coils 23, 24 is the same, these coils 23, 24 are energized by the high frequency pulse currents opposite in phase to each other. Conversely, if the winding direction of the coils 23, 24 is reversed relative to each other, these coils 23, 24 are energized by the high frequency pulse currents opposite in phase relative to each other.

Thus, in order for the col 24 of the magnetically sensitive unit 21 to be opposite in polarity in case of using the magnetic metal sensor 40 as a proximity sensor, a changeover switch is provided in the driving detection circuit as later explained. The manner of using the magnetic metal sensor 40 as the proximity sensor will be explained subsequently in detail.

These coils 23, 24 are connected on a terminal block 26 with signals lines 31 to 33 via which the coils are connected to a driving detection circuit provided externally of the magnetic metal sensor 40. These coils 23, 24 are fed with the energizing current from the driving detection circuit which then detects an output.

Figure 16:
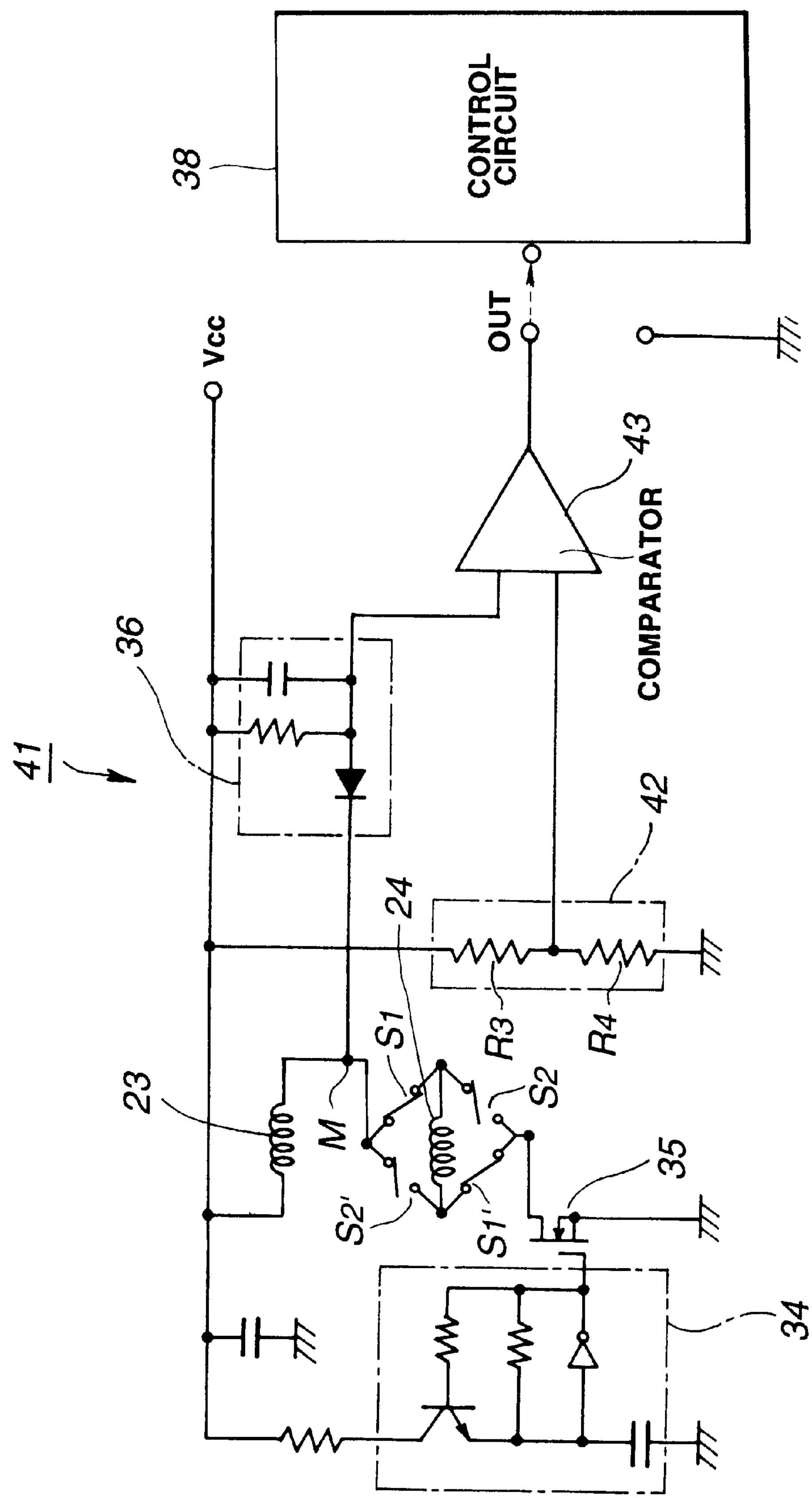
FIG. 16 is a circuit diagram showing a driving detection circuit of the magnetic metal sensor.
Figure 17:
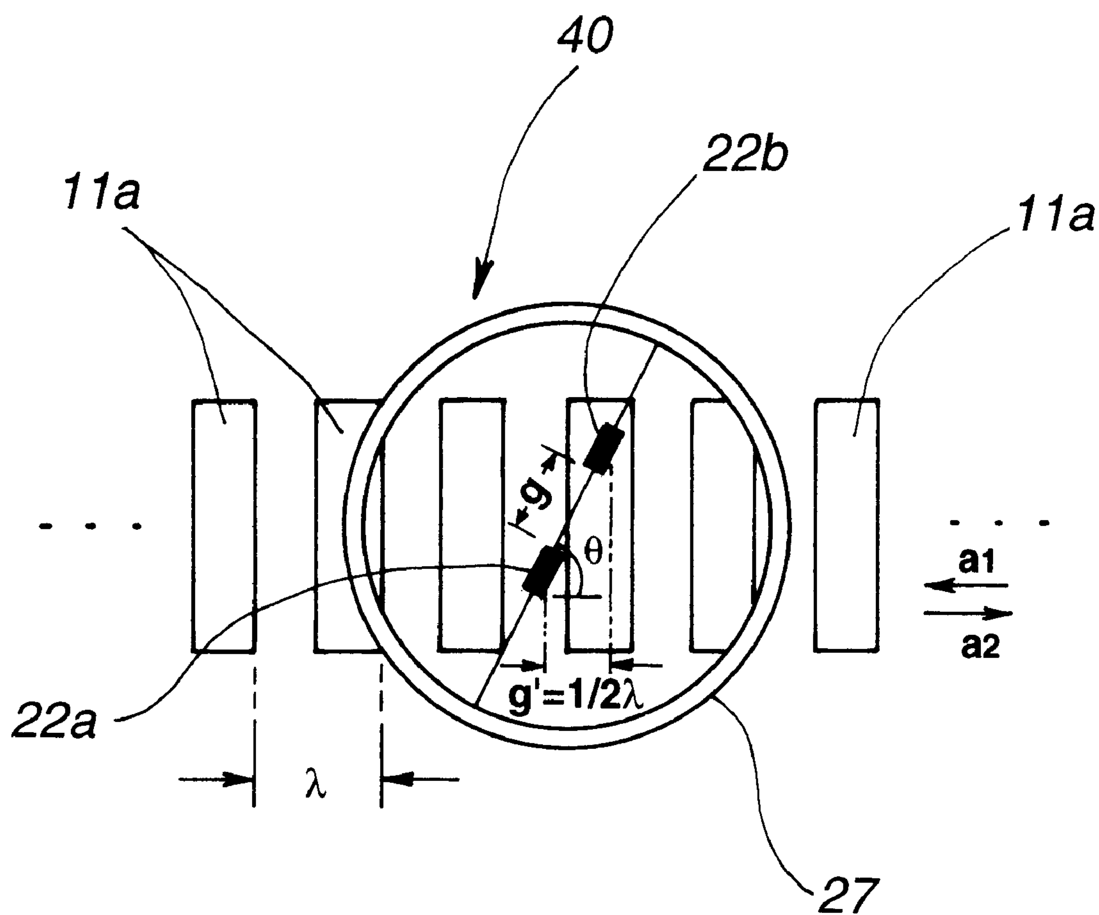
FIG. 17 shows the relative disposition between the magnetic metal sensor and the member under detection.

FIG. 16 shows a circuit diagram of the driving detection circuit 41.

The driving detection circuit 41 includes an oscillation circuit 34, a switching circuit 35 for switching between energizing currents of the col 23, 24 based on pulse signals from the oscillation circuit 34, a smoothing circuit 36 for detecting and smoothing an output voltage of the coils 23, 24, a reference voltage circuit 42 for setting the threshold level of the coils 23, 24 and a comparator circuit 43 for comparing the smoothed output of the coils 23, 24 and the threshold level.

The driving detection circuit 41 also includes switches S1, S1', S2, S2' for switching the direction of the energizing current flowing in the coil 24 to reverse the polarity of the coil 24.

The coil 23 of the magnetically sensitive unit 21 has its one end and other end connected to a source voltage Vcc and to a median point M, respectively.

The coil 24 of the magnetically sensitive unit 21 has its one end connected via switch S1 to the median point M and via switch S2 to the switching circuit 35. The coil 24 of the magnetically sensitive unit 21 also has its other end connected via switch S1' to the switching circuit 35 and via switch S2' to the median point M.

The switches S1, S1', S2, S2' are turned on/off in association operatively with each other for switching the direction of the energizing current of the coil 24.

If the magnetic metal sensor 40 is applied to the metal piece counter, the switches S1, S1' are tuned on, while the switches S2, S2' turned off to connect the coils 23, 24 in series with each other. At this time, the coils 23, 24 are of the same polarity.

If the magnetic metal sensor 40 is applied to proximity sensor, as later explained, the switches S1, S1' are tuned off, while the switches S2, S2' are turned on to connect the coils 23, 24 in series with each other. At this time, the coils 23, 24 are of the opposite polarity.

The oscillator circuit 34 generates pulse signals of the frequency of 1 MHz and the duty ratio of 1:1. Based on these pulse signals, the switching circuit 35 switches the current flowing in the series-connected coils 23, 24. This energizes the coils 23, 24 with the high frequency pulse current.

The smoothing circuit 36 detects the voltage of the median point M of the series-connected coils 23, 24 for smoothing the detected voltage. The reference voltage circuit 42 divides the source voltage by a resistor of a pre-set value to generate a reference voltage. This reference voltage is sent to the comparator circuit 43 as a threshold level of the output level of the coils 23, 24.

As the value of the reference voltage, a voltage of the median point M of the series-connected coils 23, 24 when the magnetic field or the metal is not approaching to the magnetic metal sensor 40, is set. Specifically, if the resistance value when there is no magnetic field or no rate of change to the magnetic field of the coils 23, 24, this reference voltage is set to one-half of the source voltage Vcc.

The comparator circuit 43 compares the smoothed voltage of the median point M of the coils 23, 24 supplied from the smoothing circuit 36 to the reference voltage of the threshold level supplied from the reference voltage circuit 42 to convert the voltage of the median point M to send the resulting bi-level signal to the control circuit 38.

This control circuit 38 counts the number of pulses of the bi-level signal supplied from the comparator circuit 43 to find the number of detected metal pieces 11 in order to detect from the detected number the position of relative movement between the magnetic metal sensor 40 and the member under detection 1.

Thus, it is possible with the driving detection circuit 41 to energize the coils 23, 24 with the high frequency pulse current or to detect the outputs of the coils 23, 24.

The magnet 25 is positioned and secured by a positioning portion 25*a* at a pre-set distance from the magnetically sensitive unit 21 in order to apply a uniform magnetic field to the magnetically sensitive unit 21 in a direction parallel to the direction of magnetic sensitivity. This magnet 25 is provided at a position facing the connecting portion 22*c* of the magnetically sensitive unit 21 for applying a magnetic field parallel to the direction of magnetic sensitivity to the magnetically sensitive unit 21 from the web 22*c* of the core 22. This magnet 25 may, for example, be a parallelepipedic ferrite magnet sized 1×1×2 mm and is arranged so that the 1×2 mm surface faces the web 22*c* of the magnetically sensitive unit 21. In this case, the magnet 25 is magnetized to a surface magnetic flux density of, for example, approximately 600 G so that the flux will be perpendicular to the 1×2 mm surface.

The distance 1X between the magnetically sensitive unit 21 and the magnet 25 is determined by the intensity of the magnet 25 and impedance characteristics of the magnetically sensitive unit 21 with respect to the magnetic field. Specifically, the magnetic field emanating from the magnet 25 is applied to one of the coils 23, 24 in order to detect the maximum and minimum output values. The maximum and minimum values correspond to the output of the saturated state of the magnetic field applied from the magnet 25 and to the output in the absence of the magnetic field from the magnet, respectively. Such a position which gives a median value of the detected values is found and the distance between the magnetically sensitive unit 21 and the magnet 25 at this time is set as 1X. For example, in the above-described magnetically sensitive unit 21 and the magnet 25, the distance 1x is set as 2 mm.

The above-described magnet 25 can apply the bias magnetic field in the magnetically sensitive direction. Thus, the magnetically sensitive unit 21 can be used in a range in which impedance changes are linear with respect to the external magnetic field and impedance changes show steep characteristics.

The magnetically sensitive unit 21 comprised of the substantially U-shaped open magnetic path type core 22 and the cored 22, 23 wrapped thereon and the magnet 25 adapted to apply the magnetic field in the magnetically sensitive direction to the magnetically sensitive unit 21 are housed along with sealed epoxy resin in an aluminum casing 27 to constitute the magnetic metal sensor 40 in their entirety.

The magnetic metal sensor 40 has the magnetically sensitive unit 21 having the core 22 defining the open magnetic path and a magnetic field in the magnetically sensitive direction is applied by the magnet 25 across the magnetically sensitive unit 21. The core 22 of the magnetically sensitive unit 21 is provided with the coils 23, 24 arranged side-by-side and having the same polarity. Therefore, with the present magnetic metal sensor 40, if magnetic metal approaches to one of the coils 23, 24 wrapped around the core 22 provided on the magnetically sensitive unit 21, the magnetic field applied by the magnet 25 is changed. Thus, the magnetic metal sensor 40 detects changes in impedance produced responsive to changes in the magnetic field to detect whether or not magnetic metal has approached.

The arraying relation between the member under detection 1 and the magnetic metal sensor 40 is now explained.

The member under detection 1 is moved in translation by the driving unit in the direction $a_1$, $a_2$ in FIG. 14, that is in the direction of side-by-side arraying of the metal pieces 11, while the magnetic metal sensor 40 is fixed on the sensor mounting block 3. Also, the magnetic metal sensor 40 is arranged so that, if the member under detection 1 is moved in translation in the direction of side-by-side arraying of the metal pieces 11, the surface under detection 11*a* of each metal piece 11 is faced by the opening of the U-shaped core 22 of the magnetically sensitive unit 21. That is, the magnetic metal sensor 40 is arranged so that the direction of magnetic sensitivity of the magnetically sensitive unit 21 is coincident with the longitudinal direction of the metal piece 11 and perpendicular to the movement direction a1, a2 of the member under detection 1.

Also, the magnetic metal sensor 40 is arranged with a pre-set angle so that the width g' of the extensions 22*a*, 22*b* of the core 22 along the direction of movement $a_1$, $a_2$ of the member under detection 1 is equal to $(n+1/2)\lambda$, where $\lambda$ is the separation between neighboring metal pieces 11 and n is an integer not less than 0. That is, the magnetic metal sensor 40 is arranged on the sensor mounting block 3 at a pre-set angle so that, when the extension 22*a* of the core 22 faces the surface under detection 11*a* of a given metal piece 11, the other extension is not facing any of the surface under detections 11*a*.

For example, if the core 22 and the metal piece 11 are sized as defined above, the angle $\theta$ between a line interconnecting the extensions 22*a*, 22*b* and the directions of movement $a_1$, $a_2$ of the member under detection 1 can be defined by:

$$\theta=\cos-1((\lambda/2)/(w2+g))=\cos-1(0.5/1.5)=70.5°$$

By setting the arraying relation between the member under detection 1 and the magnetic metal sensor 40 as described above, the detection output of the magnetic metal sensor 40 issued when the member under detection 1 is moved in translation in the direction $a_1$ and $a_2$ repeats the following states: That is, the detection output of the magnetic metal sensor 40 alternately repeats the state in which the extension 22*a* is responsive under the effect of a given metal piece 11 while the extension 22*b* is not responsive under the effect of any of the metal pieces 11 and the state in which the extension 22*b* is responsive under the effect of a given metal piece 11 while the extension 22*a* is not responsive under the effect of any of the metal pieces 11.

Thus, the position of movement of the member under detection 1 can be detected by counting the alternately repeated detection outputs.

The operation of detecting the metal piece 11 by the magnetic metal sensor 40 is explained.

Figure 18:
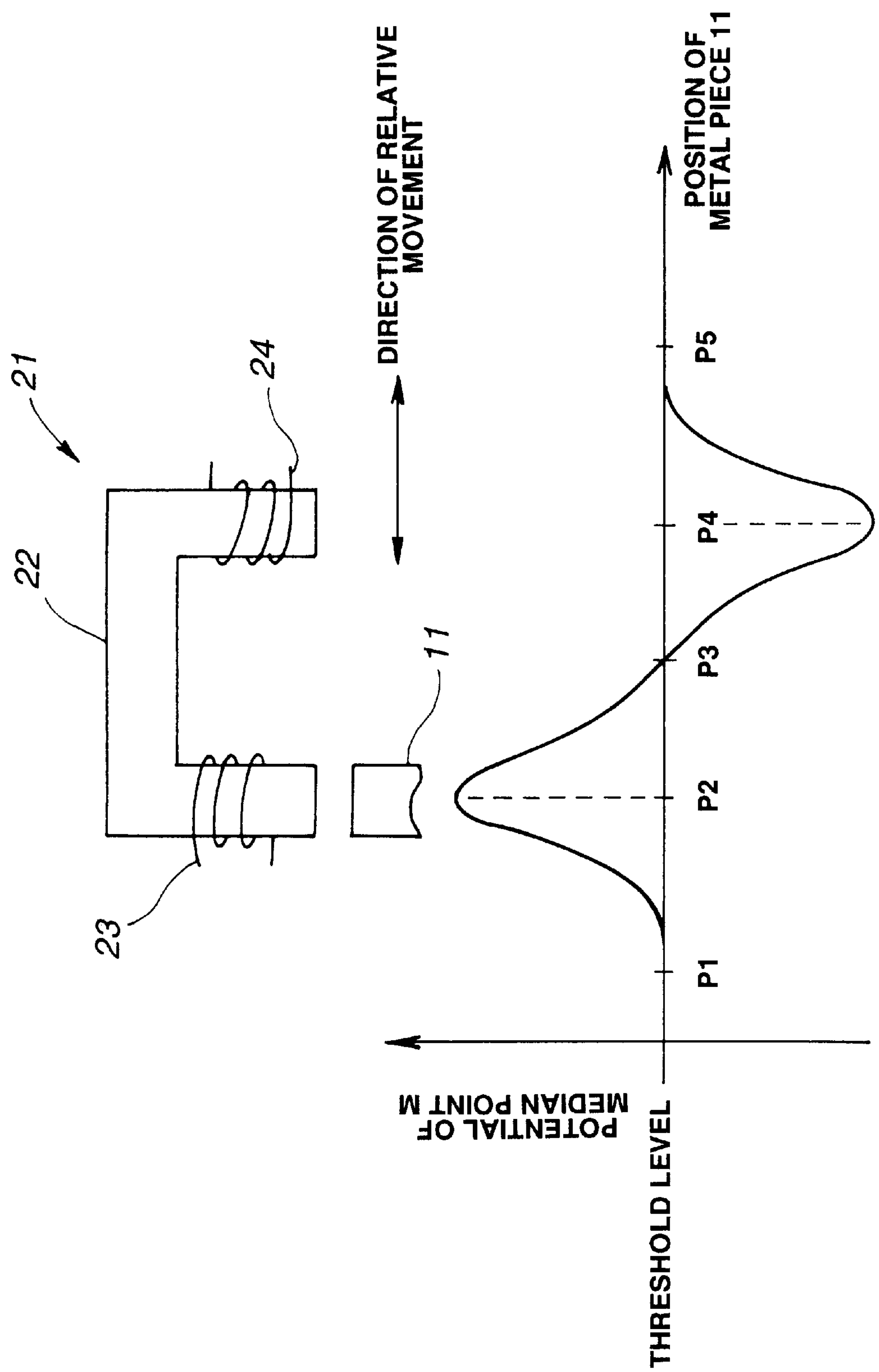
FIG. 18 illustrates the operation of detection a metal piece by the magnetic metal sensor employed as the metal piece counter.

First, the detection output in case a given metal piece 11 is moved from the coil 23 to the coil 24 of the magnetic metal sensor 40 is explained with reference to FIG. 18. In FIG. 18, the position of a sole metal piece 11 relative to the coils 22, 23 is indicated on the abscissa, while the voltage of the median point M in case of the series-connection of the coils 23, 24, as detected by the driving detection circuit 41 shown in FIG. 16, is indicated on the ordinate. The threshold level on the ordinate stands for the voltage of the median point M when the magnetic field or metal is not close to the magnetic metal sensor 40.

When the metal piece 11 is at a position P1 in which it is not close to the coils 23, 24, the magnetic reluctance of the magnetic circuit of the magnetic flux traversing the coils 23, 24 is not changed, such that the number of magnetic flux lines produced by the magnet 25 is not changed. Therefore, the impedance of the coils 23 or 24 is not changed and hence the voltage of the median point M is at a threshold level.

If the metal piece 11 approaches to the coil 23, since the magnetic permeability of the metal piece 11 is larger than that of air, the magnetic reluctance of the magnetic flux traversing the coil 23 is decreased, while the number of magnetic flux lines supplied by the magnet 25 is increased. Since the coil 24 is not responsive to the metal piece 11, the magnetic flux traversing the coil 24 is decreased in an amount corresponding to the increased magnetic flux of the coil 23. Thus, as the metal piece 11 approaches to the coil 23, the potential of the median point M is increased progressively from the threshold level, becoming maximum when the metal piece 11 is at a position P2 closest to the coil 23.

Then, if the metal piece 11 approaches the coil 24 from the position P2 closest to the coil 23, the coil 23 is moved away from the coil 23, so that the magnetic reluctance of the magnetic circuit of the magnetic flux traversing the coil 23 is increased, such that the number of lines of the magnetic flux afforded by the magnet 25 is decreased. Conversely, the metal piece 11 approaches to the coil 24, so that the magnetic reluctance of the magnetic circuit of the magnetic flux traversing the coil 24 is decreased. Thus, the impedance of the coil 23 is increased, at the same time as that of the coil 24 is decreased. Thus, as the metal piece 11 approaches from the coil 23 to the coil 24, the potential of the median point M is progressively decreased. When the metal piece 1 reaches a mid position P3 between the coils 23 and 24, the potential at the median point M is at the threshold level, becoming lowest at a position P4 of the metal piece 11 closest to the coil 24.

When the metal piece 11 is moved from the position P4 closer to the coil 24 t a position P5 in which the metal piece 11 is close to none of the coils 23, 24, the magnetic reluctance of the magnetic circuit of the magnetic flux traversing the coils 23, 24 ceases to respond to the metal piece 11. Therefore, since none of the impedances of the coils 23, 24 is changed, the potential of the median point M is at the threshold level.

Thus, with the magnetic metal sensor 40, if the metal piece 11 is moved across the coils 23, 24, the potential of the median point m is oscillated in the plus or minus direction with the potential corresponding to the absence of the approaching metal piece 11 as a threshold level. Thus, the magnetic metal sensor 40 compares the detection output on both sides of the threshold level to detect the position of the metal piece 11 easily and reliably.

A detection output issued when the magnetic metal sensor 40 having the separation between the coils 23, 24 set to λ/2 is moved relative to plural metal pieces 11 arrayed side-by-side with the separation λ between neighboring metal pieces 11, is explained with reference to FIG. 19, in which the position of the magnetic metal sensor 40 with respect to the plural metal pieces 11 is plotted on the abscissa and the voltage of the median point M when the coils 23, 24 in the driving detection circuit 41 shown in FIG. 16 are connected in series with each other. The threshold level on the ordinate stands for the voltage of the median point M when the magnetic field or metal is not approaching to the magnetic metal sensor 40, as described above.

With the present magnetic metal sensor 40, if a given metal piece 11 is closest to the coil 23, none of the metal pieces 11 is approaching the coil 24. Thus, when the coil 23 is responsive to the metal piece 11, the coil 24 is not responsive to the metal piece 11. Therefore, the potential of the median point M as a detection output is larger than the threshold level.

Also, with the present magnetic metal sensor 40, if a given metal piece 11 is closest to the coil 24, none of the metal pieces 11 is approaching the coil 23. Thus, when the coil 23 is responsive to the metal piece 11, the coil 24 is not responsive to the metal piece 11. Therefore, the potential of the median point M as a detection output is smaller than the threshold level.

Therefore, if the magnetic metal sensor 40 is moved relative to the plural metal pieces 11, arrayed side-by-side with a separation λ between neighboring metal pieces 11, there is obtained a signal oscillated vertically about the threshold level as a detection output.

Figure 20:
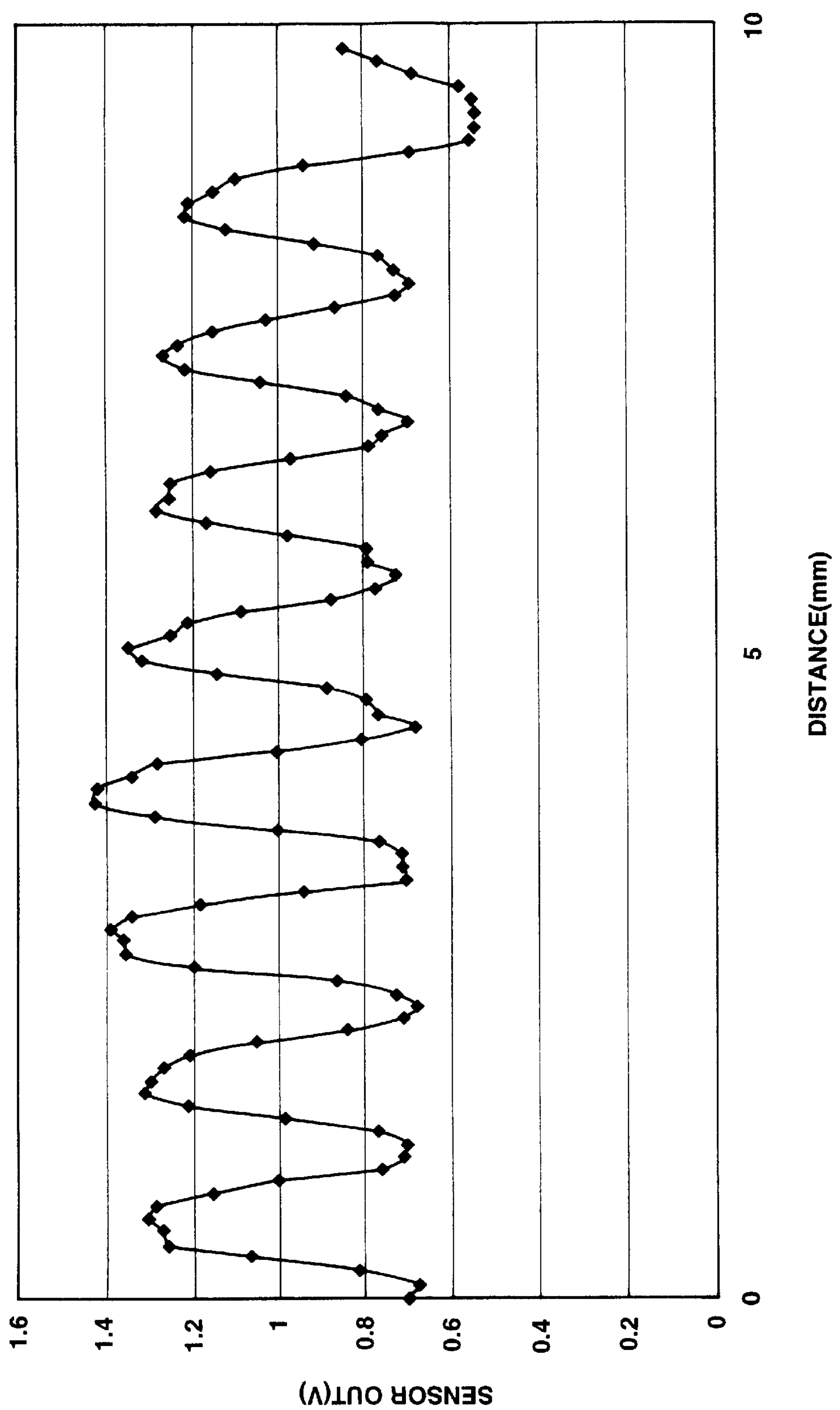
FIG. 20 shows the output voltage level of the driving detection circuit relative to the position of relative movement between the member under detection and the magnetic metal sensor.

FIG. 20 shows the relation between the potential of the median point M between the series-connected coils 23 and 24 and the position of relative movement between the magnetic metal sensor 40 and the metal piece 11 for the magnetic metal sensor 40 and the metal pieces 11 dimensioned as described above.

Thus, with the magnetic metal sensor 40, the number of the metal pieces 11 can be detected easily and reliably by comparing a detection output in case the magnetic metal sensor 40 is moved relative to the plural metal pieces 11 arranged side-by-side with the separation λ between the neighboring metal pieces 11 to the potential of the median point M for the metal piece 11 not approaching to the coils 23 or 24 as a threshold level.

In the foregoing description, the member under detection 1 is moved in translation in case of application of the present magnetic metal sensor 40 as the metal piece counter. However, since it suffices in the present invention if there occurs the relative movement between the member under detection 1 and the sensor 40, it may be the magnetic metal sensor 40 that is moved in translation.

Figure 19:
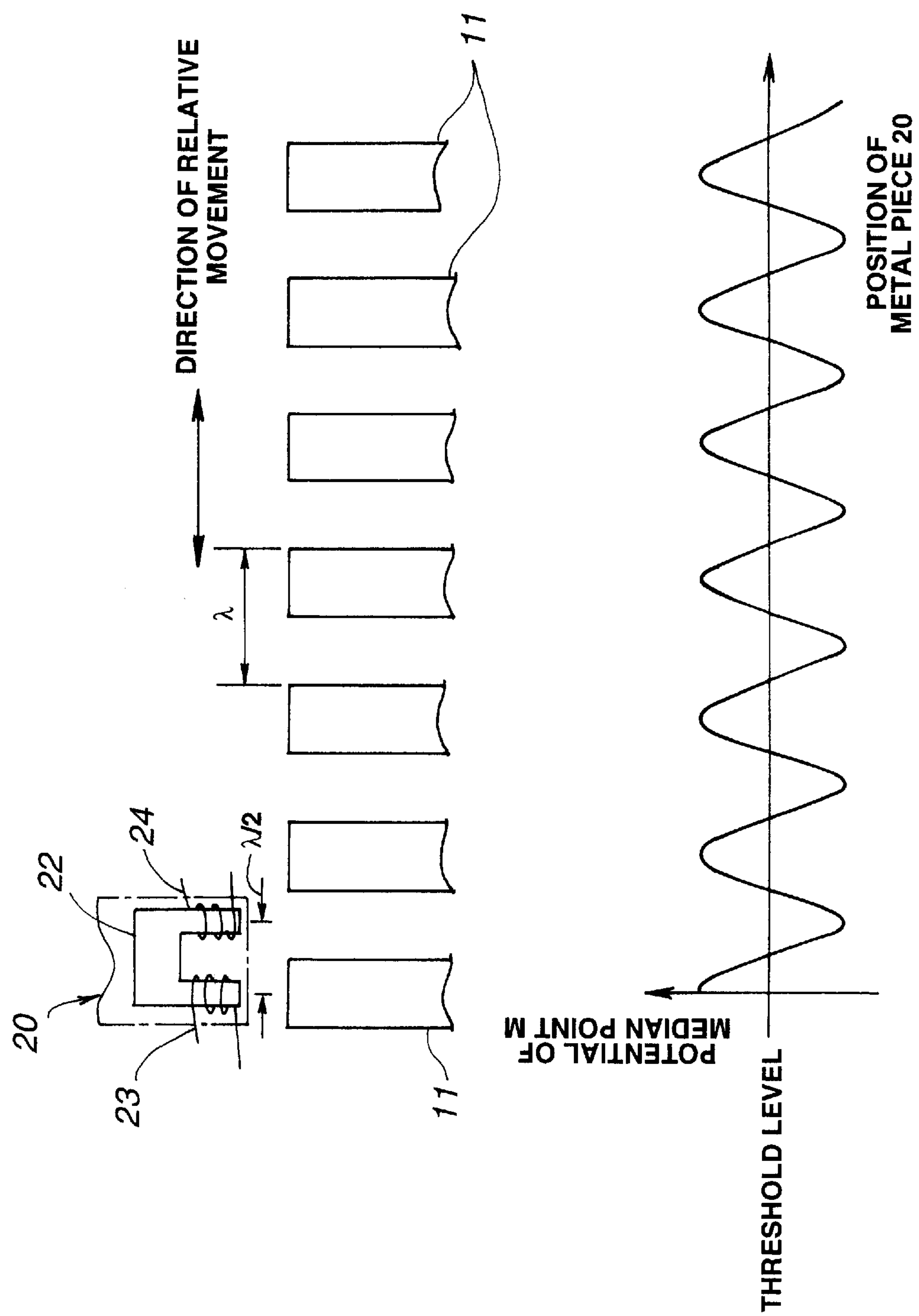
FIG. 19 illustrates the operation of detection a metal piece by the magnetic metal sensor employed as the metal piece counter.

By arranging a separate magnetic metal sensor with an offset of $(M \pm 1/4)\lambda$ relative to the magnetic metal sensor 40, where m is an integer, along the direction of relative displacement, a two-phase signal can be produced which is made up of the signal shown in FIG. 19 and the same signal having a phase difference of 90° relative thereto. Therefore, since a signal outputting the amount of relative movement can be produced based on this two-phase signal, a position detection unit can be constituted using this the magnetic metal sensor 2.

The member under detection may be designed as a columnar member and designed for measuring the number f revolutions or the angle.

If the driving detection circuit is wired as shown in the circuit diagram of FIG. 7, and the coils 23, 24 are wired so as to be energized in the same direction, the potential of the coils 23, 24 can be sliced at a pre-set level to generate bi-level signals in order to count the metal pieces.

The case in which the above-described magnetic metal sensor 40 is applied as a proximity sensor is explained.

If the magnetic metal sensor 40 is applied as a proximity sensor, it may be used in a system for judging whether or not a robot arm has approached a pre-set position to control the arm position or in a system in which slack or failure in tightening a set screw mounted on a workpiece is detected by way of checking the operational process.

If the magnetic metal sensor 40 is used as a proximity sensor for metal, the coils 23, 24 may be designed so that the polarities of the coils 23, 24 are opposite to each other and the differential output hereof is detected to improve the detection sensitivity.

That is, if the magnetic metal sensor 40 is used as the proximity sensor, the switches S1, S1' are turned off, while the switches S2, S2' are turned off, in the driving detection circuit 41 of FIG. 16, as an example, for reversing the phase of the energizing current caused to flow through the coils 23, 24. Thus, if the winding directions of the coils 23, 24 are the same, these coils are energized by oppositely phased high frequency pulse currents. Conversely, if the winding directions of the coils 23, 24 are reversed, the coils are energized by the in-phase high frequency pulse currents.

By detecting the difference value between the coils 23, 24, thus energized, the metal of the magnetic metal sensor 40 an be used as high sensitivity proximity sensor.

The operation of detection by the magnetic metal sensor 40, used as a proximity sensor, is explained with reference to FIG. 21.

Figure 21:
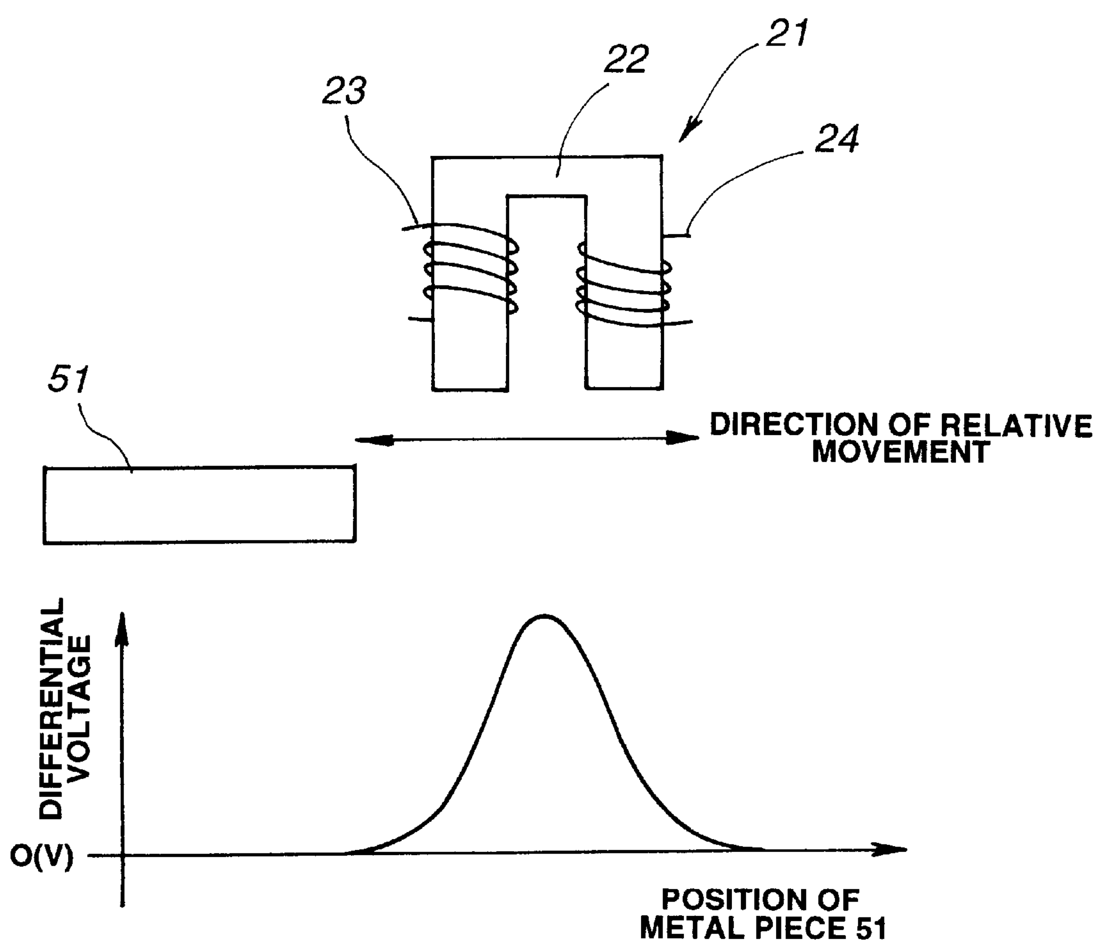
FIG. 21 illustrates the operation of detecting the metal piece by the magnetic metal sensor in case the magnetic metal sensor is used as a proximity sensor.

FIG. 21 shows a detection output produced when a sole metal piece 51 is moved from the coil 23 to the coil 24 of the magnetic metal sensor 40. In FIG. 21, the position of the metal piece 51 relative to the coils 23, 24 is plotted on the abscissa and the differential voltage of the coils 23, 24 is plotted on the ordinate.

If the metal piece 51 is not proximate to the magnetically sensitive unit 21 of the magnetic metal sensor 40, there is produced no voltage difference across the coils 23, 24, with the output being zero. If the metal piece 51 approaches to the magnetically sensitive unit 21, the impedance of one of the coils 23, 24 is increased, while that of the other of the coils 23, 24 is lowered, because the coils 23, 24 are of opposite polarities. The result is the increased differential voltage.

When the metal piece 51 has come to a position facing both the coils 23, 24, the differential voltage is at the maximum level.

Therefore, with the present magnetic metal sensor 40, it can be judged whether or not the metal piece 51 has approached by setting a voltage threshold level and converting the detected differential voltage to bi-level signals using this threshold level.

The magnetic metal sensor 40 can be used as a metal piece counter 11 or as a detector for proximate magnetic metal piece by switching the polarities of the coil 24 by the switches S1, S1', S2, S2'. Thus, the magnetic metal sensor 40 having both of these functions can be provide at low costs.

Meanwhile, in the above-described driving detection circuit 41, the comparator circuit 43 compares the voltage at the threshold level produced by the reference voltage circuit 42 to the voltage at the median point M of the coils 23, 24 to convert the resulting value into bi-level signals. Thus, if the threshold level when applying the magnetic metal sensor 40 to a metal piece counter differs from that when applying the magnetic metal sensor 40 as a proximity sensor, it suffices if the ratio of the resistances R3 and R4 of the reference voltage circuit 42 is changed. The ratio of the resistors R3, R4 can be modified and set using e.g., a trimmer.

If this resistance ratio cannot be changed, the comparator circuit 43 is replaced by a differential amplifier and the differential voltage is directly supplied to the system controller which then performs A/D conversion to collect data in order to apply the magnetic metal sensor 40 to both the metal piece counter and the proximity sensor.

The case of applying a magnetic impedance effect device to the magnetically sensitive unit 21 of the magnetic metal sensor 40 is explained.

In the foregoing description, the magnetic metal sensor 40 having the magnetically sensitive unit 21 comprised of the substantially U-shaped core 22 on both extensions **22*a*, 22*b* of which are wrapped the coils 23, 24 is explained. However, the magnetic metal sensor of the present invention may be modified so that so-called magnetic impedance effect (MI) devices 61, 62 as proposed in Japanese Laying-Open patent Application 6-281712 may also be applied to the magnetically sensitive unit 21**.

Figure 22:
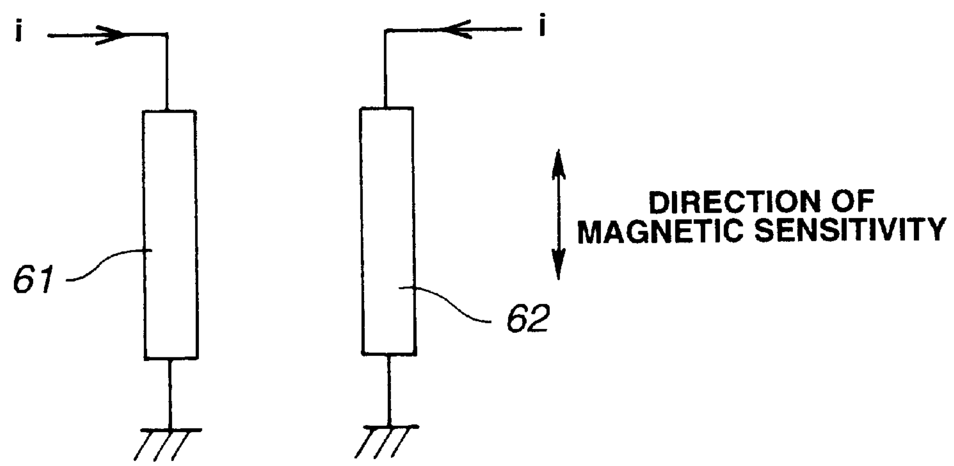
FIG. 22 illustrates a MI device.

These MI devices 61, 62 are formed of amorphous alloys of Fe, Si, Co or B. These MI devices 61, 62 are substantially wire-shaped, as shown in FIG. 22. If the MI devices 61, 62 are fed with high frequency current in the longitudinal direction, that is in the magnetic sensitive direction, there are produced impedance changes with respect to the external magnetic field applied in the longitudinal direction.

Figure 23:
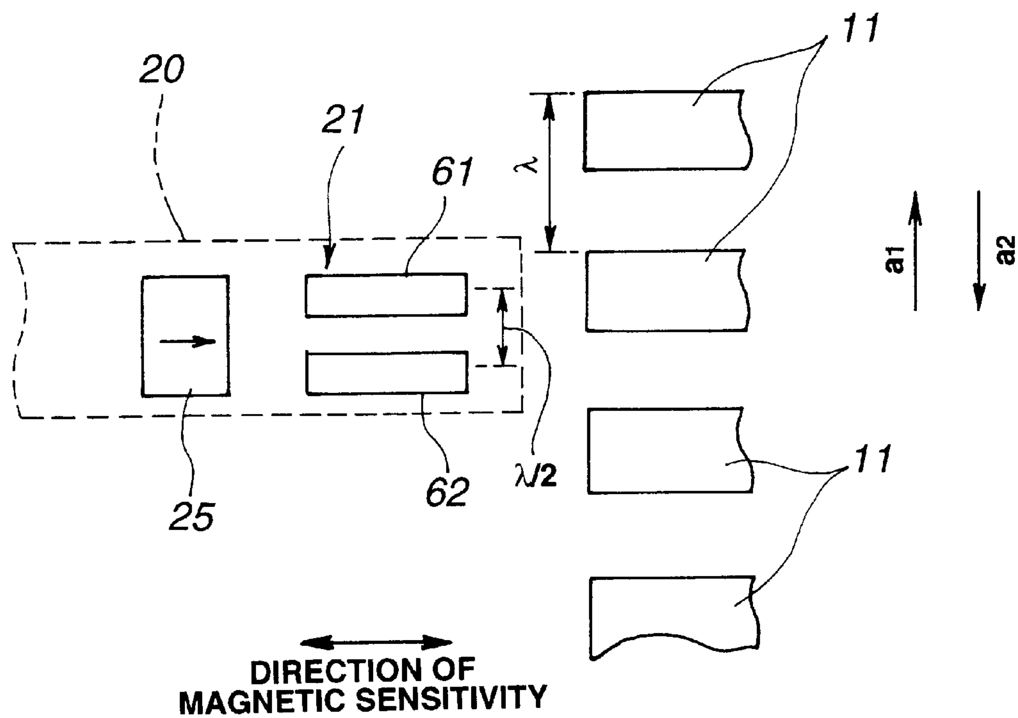
FIG. 23 illustrates the disposition of the second embodiment the magnetic metal sensor in case of using the MI device.

FIG. 23 shows the arraying relation when the magnetic metal sensor 40 having these MI devices 61, 62 is applied to the metal piece counter.

These MI devices 61, 62 are arranged with a pre-set width g with the longitudinal directions thereof in parallel to each other, and are arrayed in register with the extensions **22*a*, 22*b*. There is applied a magnetic field parallel to the longitudinal direction by the magnet 25, such that the MI devices 61, 62 exhibit extremely high sensitivity to the external magnetic field applied in this direction. Moreover, the MI devices 61, 62** undergo impedance changes with respect to the external magnetic field in this direction with an extremely high change rate.

The MI devices 61, 62 are energized with the high frequency pulse current. If the magnetic metal sensor 40 is applied to the metal piece counter, the MI devices 61, 62 are energized with the in-phase high frequency pulse currents having the same direction of magnetic sensitivity, with the polarities being the same.

If the magnetic metal sensor 40 employing the MI devices 61, 62 is used as a proximity sensor, the polarities are reversed, as in the case in which the coils 23, 24 are wrapped about the core 22, as described above. This switching is by a switch provided in the driving detection circuit which will be explained subsequently.

These MI devices 61, 62 are connected over signal lines to the driving detection circuit provided outside of the magnetic metal sensor 40. The MI devices 61, 62 are fed with the energizing current from the driving detection circuit which then detects an output.

Figure 24:
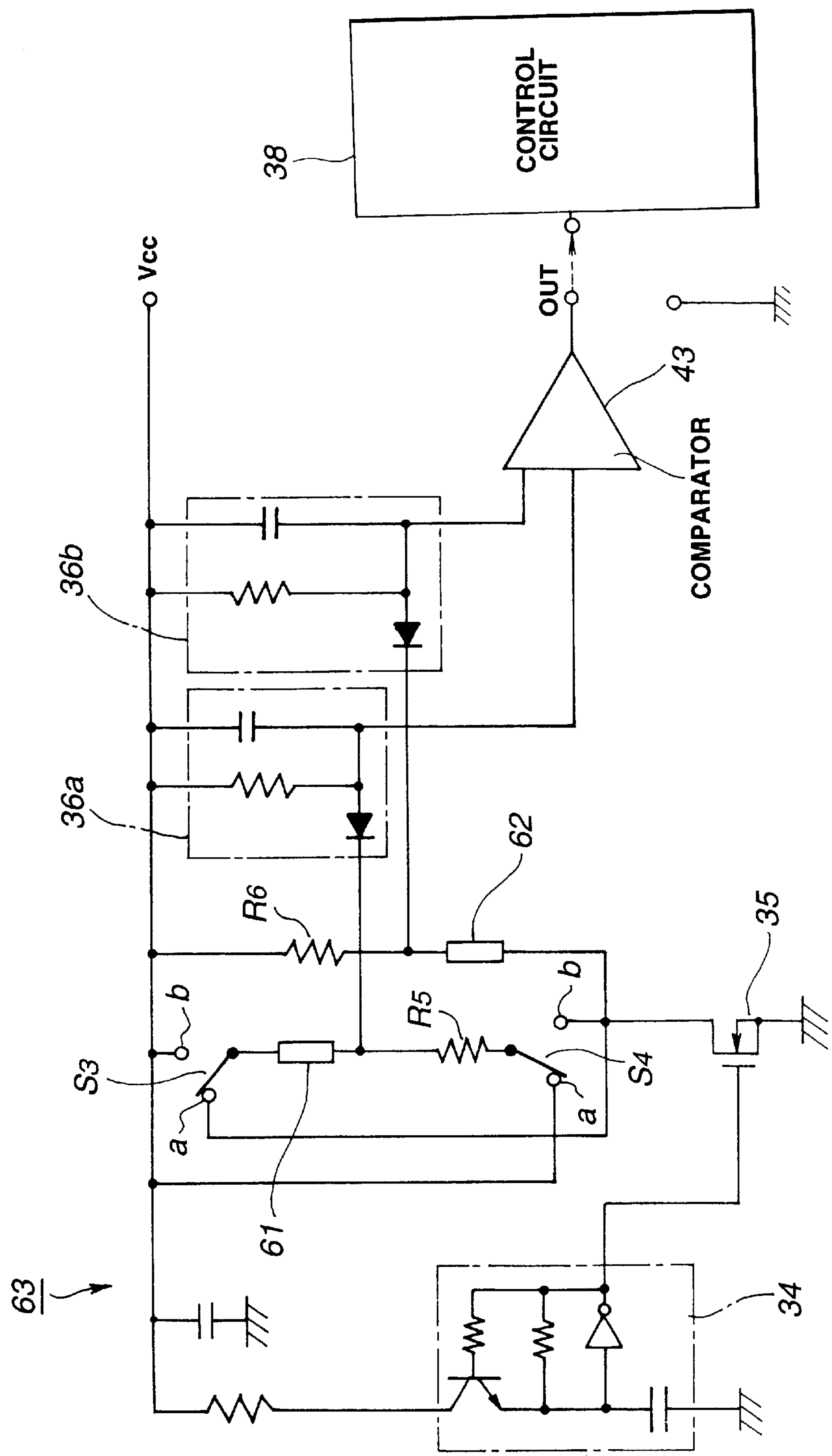
FIG. 24 is a circuit diagram of a driving detection circuit of the magnetic metal sensor employing the MI device.

FIG. 24 shows a circuit diagram of the driving detection circuit for the MI devices 61, 62.

The driving detection circuit 63 includes an oscillation circuit 34, a switching circuit 35 for switching the energizing currents of the MI devices 61, 62 based on the pulse currents from the oscillation circuit 34, a smoothing circuit **36*a* for detecting and smoothing an output voltage of the MI device 61, a smoothing circuit 36*b* for detecting and smoothing an output voltage of the MI device 62 and a comparator circuit 43 for comparing the outputs of the smoothed MI devices 61, 62**.

The driving detection circuit 63 includes switches S3 and S4 for switching the direction of the energizing currents of the MI device 61.

The MI device 62 has its one end fed with the source voltage Vcc via resistor R6, while having its other end connected to the switch S3. When set to the side of the terminal a or to the terminal b, the switch S3 connects the opposite end of the MI device 61 to the switching circuit 35 and to the power source, respectively.

The resistor R5 has its one end connected to the MI device 61 and its other end to the switch S4. When set to the terminal a or to the terminal b, the switch S3 connects the opposite end of the MI device 61 to the switching circuit 35 or to the power source, respectively.

The switches S3 and S4 are operatively associated with each other so as to be set to the terminal a or to the terminal b, respectively.

That is, if the magnetic metal sensor 40 is applied to the metal piece counter and used for detecting the position of movement of the member under detection 1 having plural metal pieces 11 arranged side-by-side, the switches S3, S4 are both set to the side of the terminal a, with the MI device 61 being of the same polarity as the MI device 62. The connection of the resistor R1 and the MI device 61 and the connection of the resistor R2 and the MI device 62 are connected in parallel between the power source Vcc and the switching circuit 35.

If the magnetic metal sensor 40 is used for detecting the proximate magnetic metal piece, the switches S3, S4 are both set to the side of the terminal b, with the MI device 61 being opposite in polarity to the MI device 62. The connection of the resistor R1 and the MI device 61 and the connection of the resistor R2 and the MI device 62 are reversed between the power source Vcc and the switching circuit 35 to constitute a bridge circuit.

The smoothing circuit 36*a* detects the voltage at a junction point between the MI device 61 and the resistor R5 for smoothing the detected voltage. The smoothing circuit 36*b* detects the voltage at a junction point between the MI device 62 and the resistor R6 for smoothing the detected voltage.

The comparator circuit 43 compares the output voltage of the MI device 61 smoothed by the smoothing circuit 36*a* to the output voltage of the MI device 62 smoothed by the smoothing circuit 36*b* to send the differential voltage to the control circuit 38.

If the magnetic metal sensor 40 is applied to the metal piece counter, the control circuit 38 converts the differential voltage from the comparator circuit 43 to bi-level signals, by slicing at a pre-set threshold, and counts the number of pulses, in order to find the number of times of detection of the metal pieces 11. The position of relative movement between the magnetic metal sensor 40 and the member under detection 1 can be detected from the number of times of detection.

If the magnetic metal sensor 40 is applied to a proximity sensor, the control circuit 38 detects the differential voltage from the comparator circuit 43 to compare the differential voltage to a pre-set threshold in order to detect whether or not the magnetic metal piece 51 is proximate.

The above-described magnetic metal sensor 40 can be used as the metal piece counter or for detecting the proximate magnetic metal pieces by switching the polarity of the MI device 61 by the switches S3, S4. Thus, the magnetic metal sensor 40 having these two functions can be provided inexpensively. Since the magnetic metal sensor 40 can use the MI device, the magnetic metal sensor of superior characteristics can be manufactured at low costs.

Although the magnetic impedance effect device is used in the magnetically sensitive unit 21 in the above-described second embodiment of the magnetic metal sensor 40, this magnetic impedance effect device can be used in the above-described first embodiment of the magnetic metal sensor 40. In this case, it suffices if a circuit corresponding to the driving detection circuit 63 of FIG. 24 in which the switches S3, S4 are both set to the terminal b is used in place of the driving detection circuit 30 shown FIG. 7.

The energizing current supplied to the coils or to the MI devices may also be of a waveform composed of a sine wave signals added to with a dc component, without being limited to the rectangular signals.

What is claimed is:

1. A magnetic metal sensor moved relative to a unit under detection comprised of a plurality of magnetic metal pieces arrayed side-by-side at a predetermined interval $\lambda$ along a direction of side-by-side arraying of said plurality of magnetic metal pieces for detecting said magnetic metal pieces, comprising:

a pair of magneto-electric conversion units each having a magnetically sensitive portion which responds to variations in a magnetic field along a direction of magnetic sensitivity; and magnetic field generating means for applying the magnetic field along the direction of magnetic sensitivity to the magnetically sensitive portions of said pair of respective magneto-electric conversion units, wherein the improvement resides in that the magnetically sensitive portions in said pair of respective magneto-electric conversion units are of the same polarity, the direction of magnetic sensitivity is perpendicular to the direction of side-by-side arraying of said magnetic metal pieces, and a separation g' between neighboring magnetic metal pieces along a movement direction is given by:

$$g'=(n+1/2)\lambda$$

n being an integer not less than 0.

2. The magnetic metal sensor as claimed in claim 1 wherein the magnetically sensitive portions include respective coils energized by respective currents of a predetermined frequency for generating a second magnetic field along a second direction parallel to the direction of magnetic sensitivity.

3. The magnetic metal sensor as claimed in claim 1 wherein the magnetically sensitive portions include respective magnetic impedance effect devices fed with respective currents of a predetermined frequency along a second direction parallel to the direction of magnetic sensitivity.

4. A magnetic metal sensor comprising:

a pair of magneto-electric conversion units each having a magnetically sensitive portion which responds to variations in a magnetic field along a direction of magnetic sensitivity;

magnetic field generating means for applying the magnetic field along the direction of magnetic sensitivity to the magnetically sensitive portions of said pair of respective magneto-electric conversion units; and switching means for switching a polarity in the direction of magnetic sensitivity of one of the magnetically sensitive portions of said pair of respective magneto-electric conversion units, wherein when the magnetically sensitive portions of said pair of respective magneto-electric conversion units are of the same polarity, the magnetically sensitive portions move relative to portions under detection in a side-by-side arraying direction of the portions under detection for detecting the portions under detection, the portions under detection including a plurality of magnetic metal pieces arranged side-by-side at a predetermined interval λ, the direction of magnetic sensitivity is perpendicular to the side-by-side arraying direction of the magnetic metal pieces, a separation g' between neighboring magnetic metal pieces along a movement direction is $$g'=(n+1/2)\lambda$$

n being an integer not less than 0, and, when the magnetically sensitive portions of said pair of respective magneto-electric conversion units are of opposite polarities, the magnetic metal sensor detects displacement of the magnetically sensitive portions of said pair of respective magneto-electric conversion units.

5. The magnetic metal sensor as claimed in claim 4 wherein the magnetically sensitive portions include respective coils energized by a current of a predetermined frequency for generating a second magnetic field along a second direction parallel to the direction of magnetic sensitivity.

6. The magnetic metal sensor as claimed in claim 4 wherein the magnetically sensitive portions include respective magnetic impedance effect devices fed with respective currents of a predetermined frequency along a second direction parallel to the direction of magnetic sensitivity.

7. A method for detecting a plurality of magnetic metal pieces arrayed side-by-side at a predetermined interval, comprising:

arraying a magnetic metal sensor including a pair of magneto-electric conversion units having respective magnetically sensitive devices responding to variations in a magnetic field along a direction of magnetic sensitivity and a magnetic field generator for applying a magnetic field along the direction of magnetic sensitivity to the magnetically sensitive devices of said pair of respective magnetic-electric conversions units, so that the direction of magnetic sensitivity of the magnetically sensitive devices is perpendicular to a side-by-side arraying direction of the magnetic metal pieces and the magnetically sensitive devices are of the same polarity, the magnetically sensitive devices being arrayed so that a separation g' between neighboring magnetically sensitive devices will be given by $$g'=(n+1/2)\lambda$$

where n is an integer not less than 0;

moving the magnetic metal sensor along the side-by-side arraying direction of the magnetic metal pieces;

detecting detection signals supplied by said pair of respective magneto-electric conversion units; and comparing detection signals from said pair of respective magneto-electric conversion units to detect the magnetic metal pieces.

* * * * *